United States Patent
Noma et al.

(10) Patent No.: US 10,983,647 B2
(45) Date of Patent: Apr. 20, 2021

(54) METHOD FOR MANUFACTURING CIRCUIT BOARD

(71) Applicant: Sharp Kabushiki Kaisha, Sakai (JP)

(72) Inventors: Mikihiro Noma, Sakai (JP); Takatoshi Kira, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/636,724

(22) PCT Filed: Aug. 3, 2018

(86) PCT No.: PCT/JP2018/029171
§ 371 (c)(1),
(2) Date: Feb. 5, 2020

(87) PCT Pub. No.: WO2019/031400
PCT Pub. Date: Feb. 14, 2019

(65) Prior Publication Data
US 2020/0245468 A1 Jul. 30, 2020

(30) Foreign Application Priority Data
Aug. 10, 2017 (JP) .............................. JP2017-155745

(51) Int. Cl.
*H05K 3/02* (2006.01)
*H05K 3/10* (2006.01)
(Continued)

(52) U.S. Cl.
CPC .......... *G06F 3/0446* (2019.05); *G06F 3/0412* (2013.01); *G06F 3/0445* (2019.05); *H05K 3/103* (2013.01)

(58) Field of Classification Search
CPC ...... H05K 3/103; H05K 3/1258; H05K 1/147; H05K 2201/10136; H05K 2201/09681;
(Continued)

(56) References Cited

U.S. PATENT DOCUMENTS 7,637,008 B2 * 12/2009 Dory ...................... H05K 3/005
29/830
8,065,797 B2 * 11/2011 Watanabe .............. H05K 3/465
29/852

(Continued)

FOREIGN PATENT DOCUMENTS

JP          5833260 B2      12/2015

*Primary Examiner* — Donghai D Nguyen
(74) *Attorney, Agent, or Firm* — Keating & Bennett, LLP

(57) ABSTRACT

A method for manufacturing a touch panel includes the steps of: forming a first imprint layer; forming a first wire forming groove portion; forming a first wire; forming a spacer layer so that the spacer layer is placed over a surface of the first imprint layer in which the first wire forming groove portion has been formed and overlaps a part of the first wire; forming a second imprint layer so that the spacer layer is sandwiched between the first imprint layer and the second imprint layer; forming a second wire forming groove portion; forming a second wire; and delaminating the spacer layer from the first imprint layer and removing, together with the delaminated portion, a portion of the second imprint layer that overlaps the delaminated portion.

12 Claims, 31 Drawing Sheets

(51) Int. Cl.
*G06F 3/044* (2006.01)
*G06F 3/041* (2006.01)

(58) Field of Classification Search
CPC .... G06F 3/0446; G06F 3/0445; G06F 3/0412; Y10T 29/49126; Y10T 29/49155
USPC .................................................. 29/830, 846
See application file for complete search history.

(56) References Cited

U.S. PATENT DOCUMENTS

| | | | |
|---|---|---|---|
| 8,179,381 B2 * | 5/2012 | Frey | G06F 3/0446 |
| | | | 345/174 |
| 2014/0253827 A1 | 9/2014 | Gao et al. | |

* cited by examiner

FIG. 7
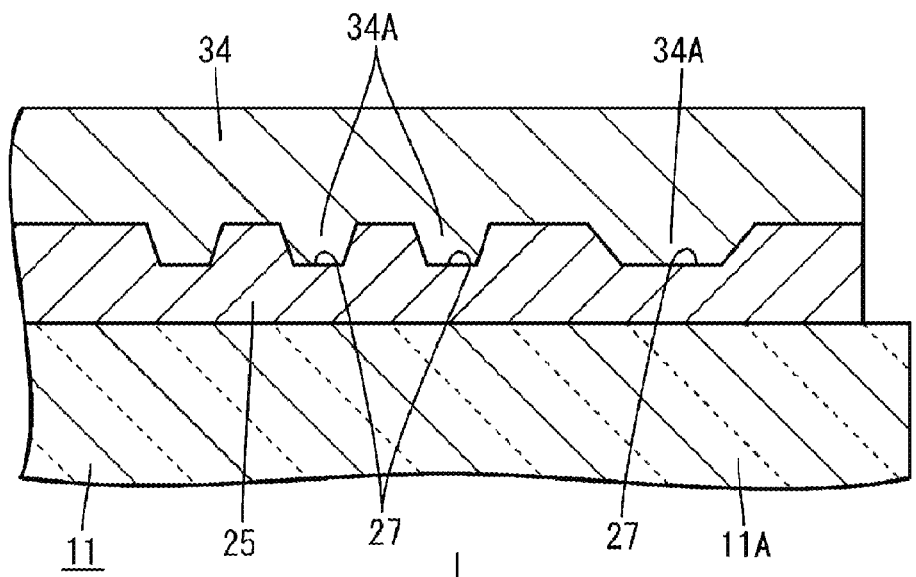
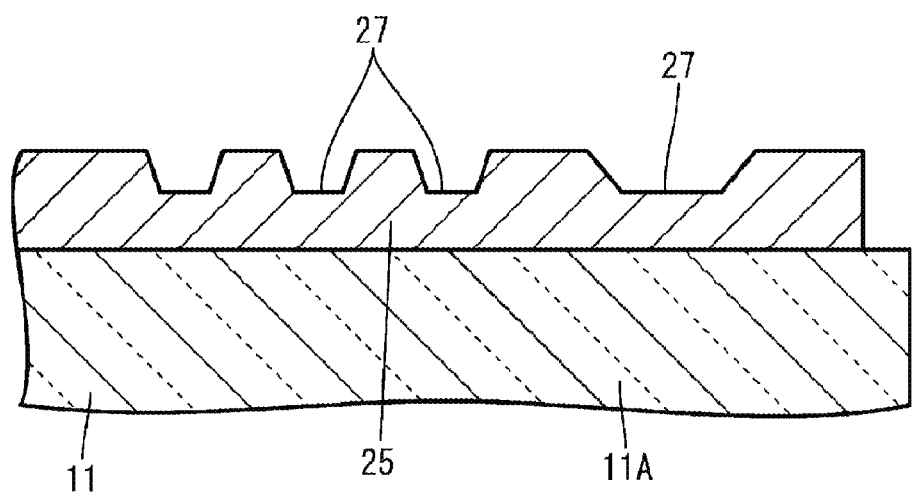

FIG. 8
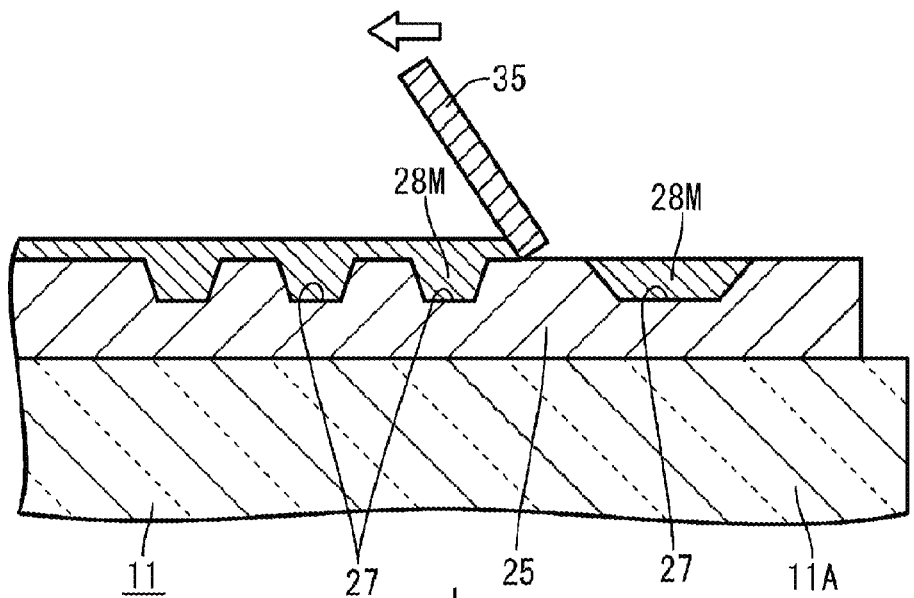
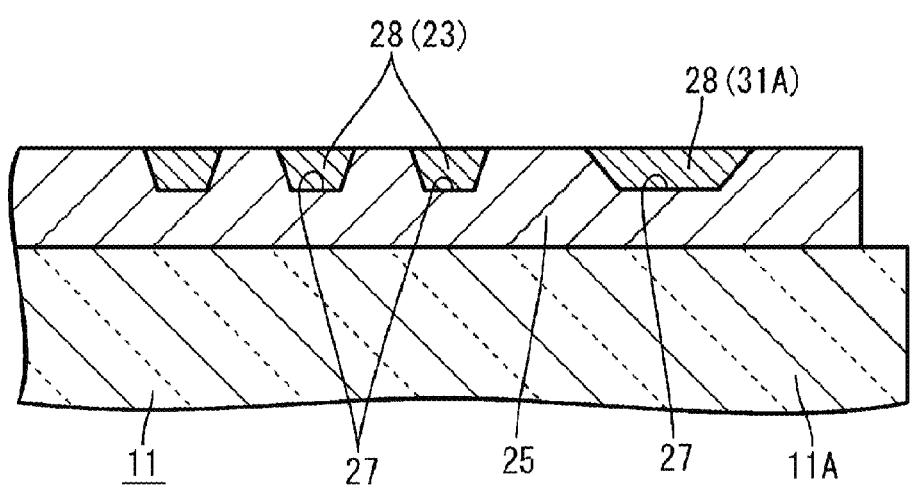
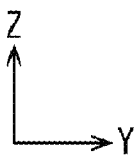

FIG. 13
(A)
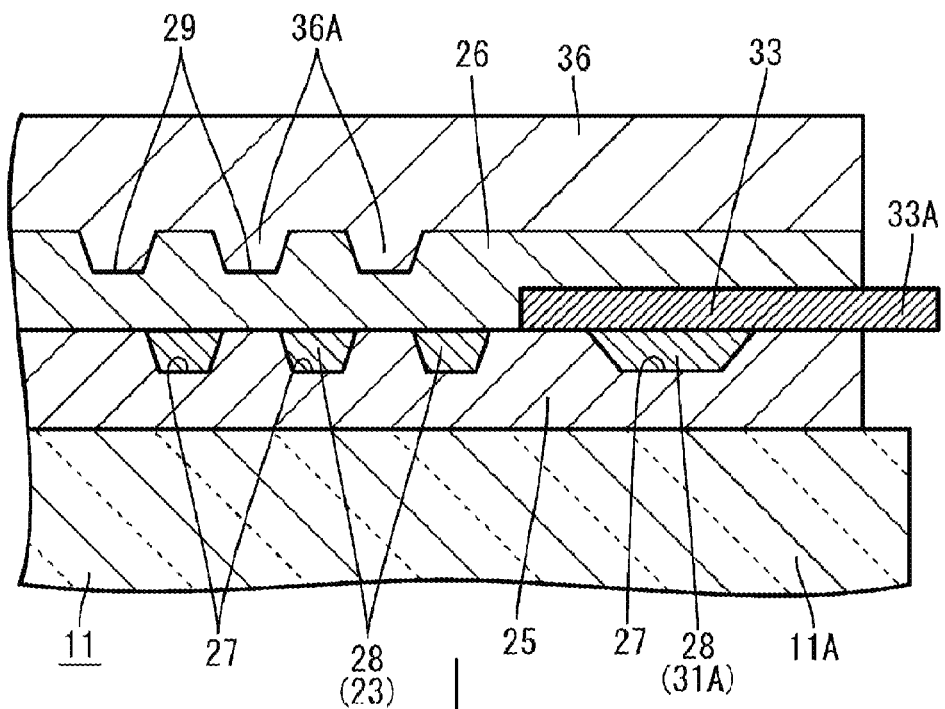
(B)
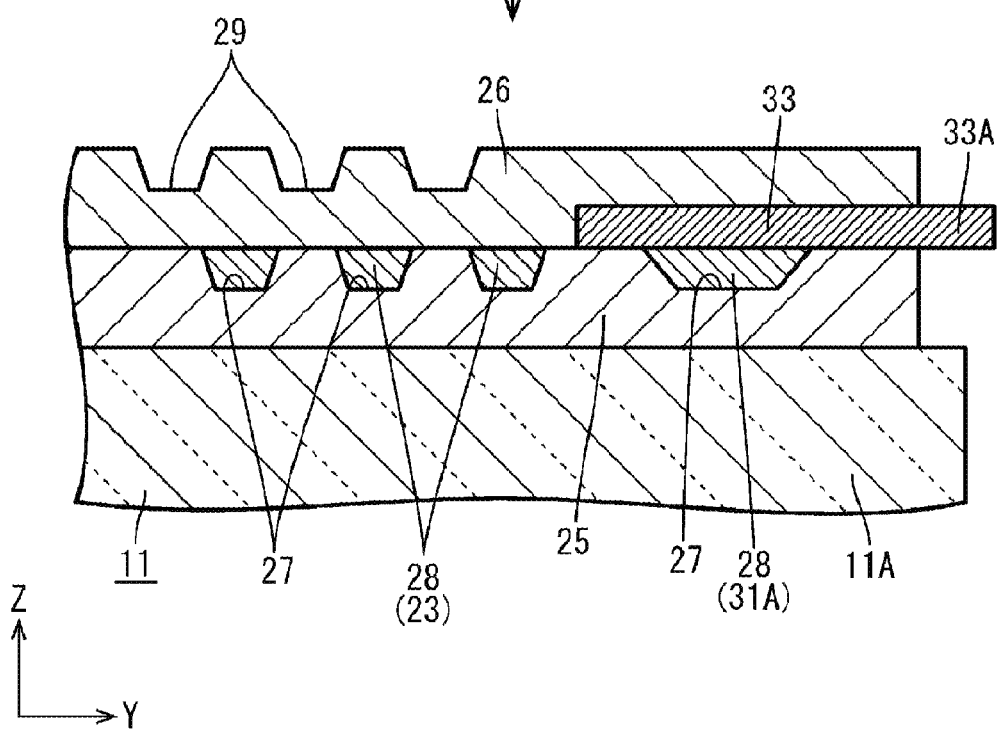

FIG. 14
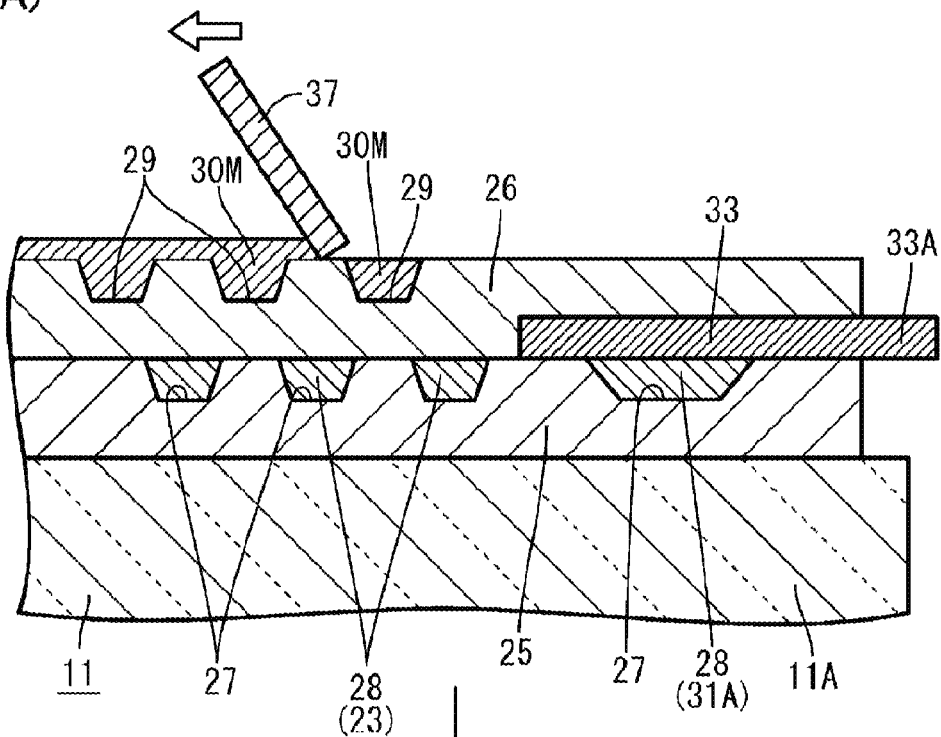
(A)
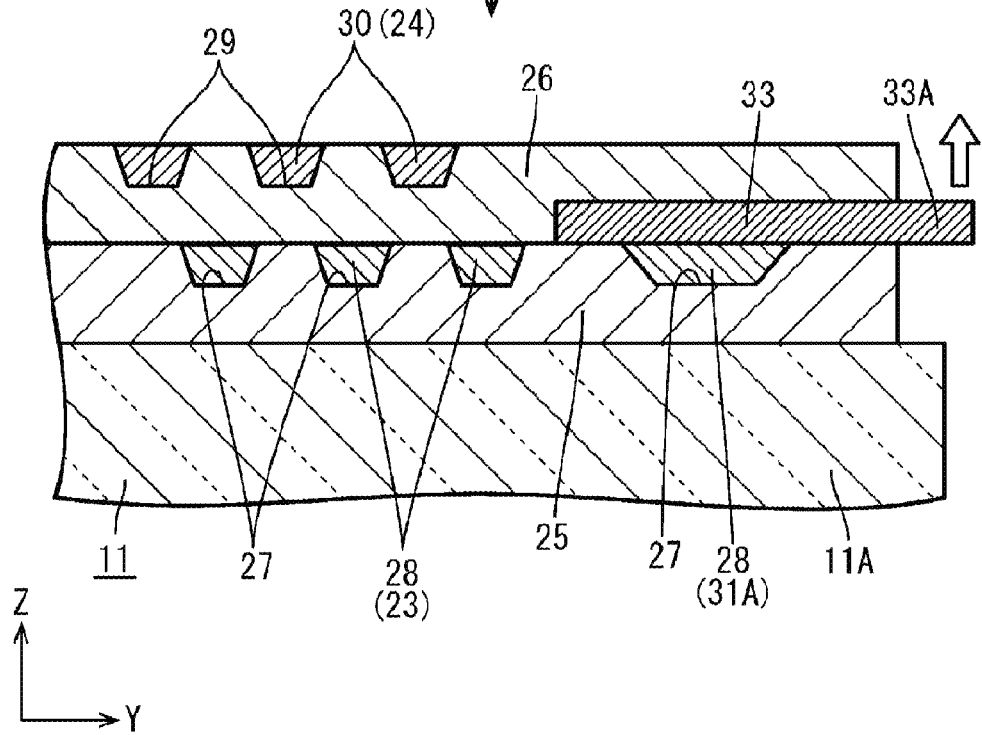
(B)

METHOD FOR MANUFACTURING CIRCUIT BOARD

TECHNICAL FIELD

The present invention relates to a method for manufacturing a circuit board.

BACKGROUND ART

In recent years, electronic apparatuses such as tablet laptop personal computers and portable information terminals have been being mounted with touch panels (touchscreens) for the purpose of enhancing operability and usability. A known example of a method for manufacturing a touch panel is described in PTL 1 listed below. The method for manufacturing a touchscreen described in PTL 1 includes the steps of: preparing a substrate including a first surface and a second surface opposite to the first surface; cutting a first groove on a side of a first matrix layer that is distant from the substrate, the first matrix layer being formed by applying a gel onto the first surface and solidifying the gel; filling the first groove with an electrical conducting material; cutting a second groove in a second matrix layer formed by applying a gel onto the side of the first matrix layer that is distant from the substrate and solidifying the gel; and forming a second conductive layer by filling the second groove with an electrical conducting material.

CITATION LIST

Patent Literature

PTL 1: Japanese Patent No. 5833260

Technical Problem

In the method for manufacturing a touchscreen described in PTL 1 listed above, the first and second matrix layers each formed by solidifying a gel are stacked, and the first and second conductive layers are formed in the first and second grooves formed in the first and second matrix layers, respectively, by using a so-called imprint technology. However, in forming the second matrix layer by applying a gel onto a surface of the first matrix layer, it is undesirably difficult to precisely control a range of formation of the second matrix layer, as the gel is spread. For this reason, in a case where a portion of the first conductive layer formed in the first groove in the first matrix layer is utilized as a terminal for connecting to an external connection part, preventing the portion of the first conductive layer that serves as the terminal from being covered with the second matrix layer requires the portion to be disposed outside an assumed maximum range of formation of the second matrix layer, posing a risk for an excessively wide frame width of the touchscreen.

SUMMARY OF INVENTION

The present invention was made in view of the above circumstances. An object is to achieve a narrower frame.

Solution to Problem

A method for manufacturing a circuit board of the present invention includes: a first imprint layer forming step of forming a first imprint layer; a first groove portion forming step of forming a first wire forming groove portion by partially depressing a surface of the first imprint layer; a first wire forming step of forming a first wire in the first wire forming groove portion; a spacer layer forming step of forming a spacer layer so that the spacer layer is placed over the surface of the first imprint layer in which the first wire forming groove portion has been formed and overlaps a part of at least the first wire; a second imprint layer forming step of forming a second imprint layer so that at least the spacer layer is sandwiched between the first imprint layer and the second imprint layer; a second groove portion forming step of forming a second wire forming groove portion by partially depressing a surface of the second imprint layer opposite to the first imprint layer; a second wire forming step of forming a second wire in the second wire forming groove portion; and a spacer layer delaminating step of delaminating at least a part of the spacer layer from the first imprint layer and removing, together with the delaminated portion, a portion of the second imprint layer that overlaps the delaminated portion.

First, in the first imprint layer forming step, a first imprint layer is formed. In the first groove portion forming step, a first wire forming groove portion is formed by partially depressing a surface of the first imprint layer. In the first wire forming step, a first wire is formed in the first wire forming groove portion of the first imprint layer. In the spacer layer forming step, a spacer layer is formed so as to overlap the surface of the first imprint layer in which the first wire forming groove portion has been formed. The spacer layer overlaps a part of at least the first wire. In the second imprint layer forming step, a second imprint layer is formed in such a manner that at least the spacer layer is sandwiched between the first imprint layer and the second imprint layer. In the second groove portion forming step, a second wire forming groove portion is formed by partially depressing a surface of the second imprint layer opposite to the first imprint layer. In the second wire forming step, a second wire is formed in the second wire forming groove portion of the second imprint layer. In the spacer layer delaminating step, at least a part of the spacer layer is delaminated from the first imprint layer. At this point in time, the delaminated portion of the spacer layer and a portion of the second imprint layer that overlaps the delaminated portion are removed. As a result, a part of the first wire of the first imprint layer can be exposed, so that the exposed portion of the first wire can be utilized as a terminal or the like. This makes it possible to achieve a narrower frame width than in the conventional case where the touchscreen has a wider frame width so that a portion of the first conductive layer that is to serve as a terminal is prevented from being covered with the second matrix layer, thereby suitably achieving a narrower frame.

Advantageous Effects of Invention

The present invention makes it possible to achieve a narrower frame.

BRIEF DESCRIPTION OF DRAWINGS

FIG. 7 is a diagram for explaining a first groove portion forming step of the method for manufacturing a touch panel and illustrates a cross-sectional view (A) showing a state where a first imprint block has been pressed against a first imprint layer uncured and a cross-sectional view (B) showing a state where the first imprint layer has been cured and first wire forming groove portions have been formed.

FIG. 8 is a diagram for explaining a first wire forming step of the method for manufacturing a touch panel and illustrates a cross-sectional view (A) showing a task of filling the first wire forming groove portions with a material of first wires with a squeegee and a cross-sectional view (B) showing a state where the first wires have been formed.

FIG. 13 is a diagram for explaining a second groove portion forming step of the method for manufacturing a touch panel and illustrates a cross-sectional view (A) showing a state where a second imprint block has been pressed against a second imprint layer uncured and a cross-sectional view (B) showing a state where the second imprint layer has been cured and second wire forming groove portions have been formed.

FIG. 14 is a diagram for explaining a second wire forming step of the method for manufacturing a touch panel and illustrates a cross-sectional view (A) showing a task of filling the second wire forming groove portions with a material of second wires with a squeegee and a cross-sectional view (B) showing a state where the second wires have been formed.

DESCRIPTION OF EMBODIMENTS

Embodiment 1

Embodiment 1 of the present invention is described with reference to FIGS. 1 to 17. The present embodiment describes a method for manufacturing a touch panel 20 of a liquid crystal display device 10 having a touch panel function. It should be noted that some of the drawings show an X axis, a Y axis, and a Z axis and are drawn so that the direction of each axis is an identical direction in each drawing. Further, FIGS. 2, 4, 6 to 8, 10, 12 to 14, and 16 serve as a basis for an up-down direction and show the front side up and the back side down.

Figure 1:
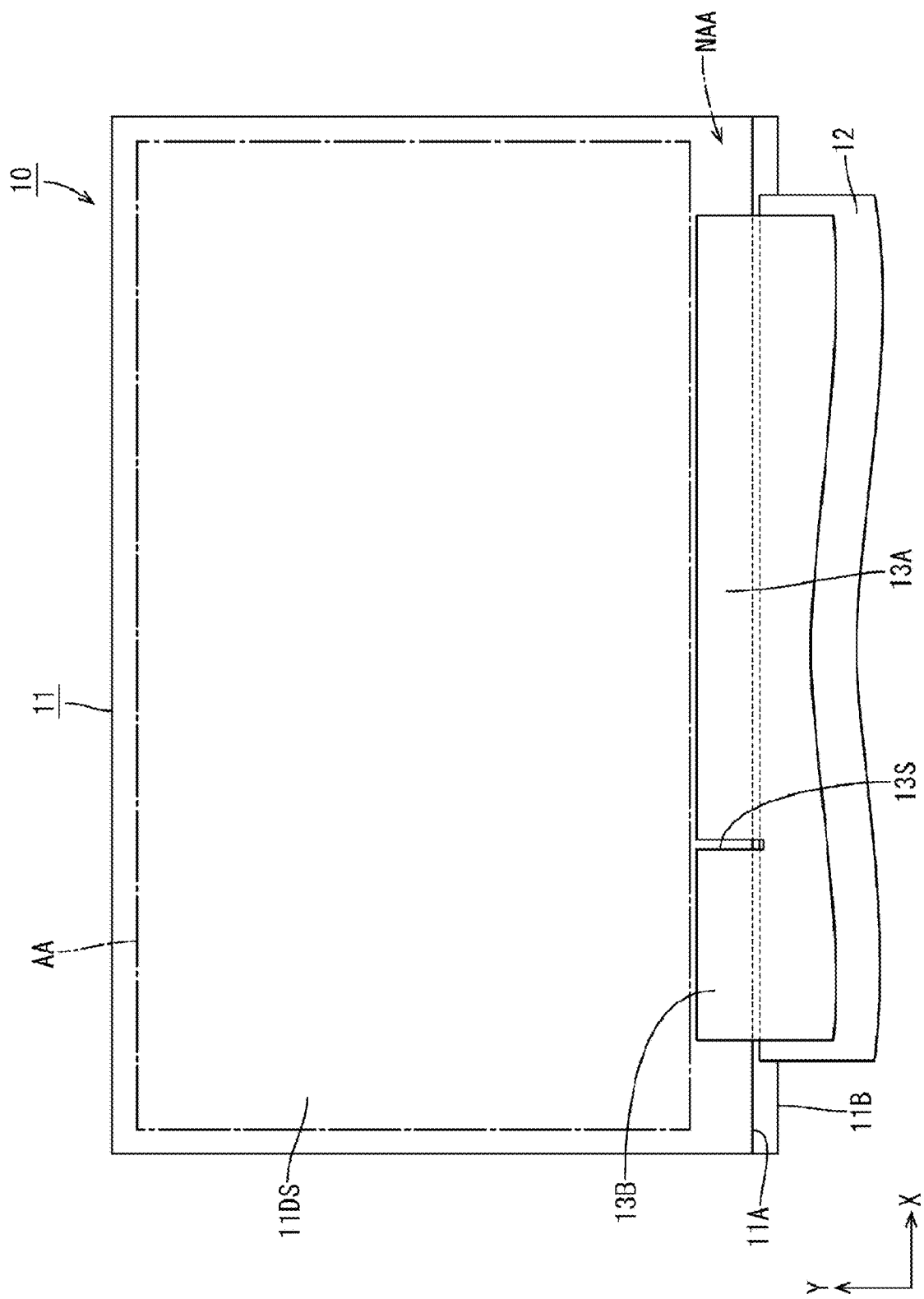
FIG. 1 is a plan view of a liquid crystal display device according to Embodiment 1 of the present invention.
Figure 2:
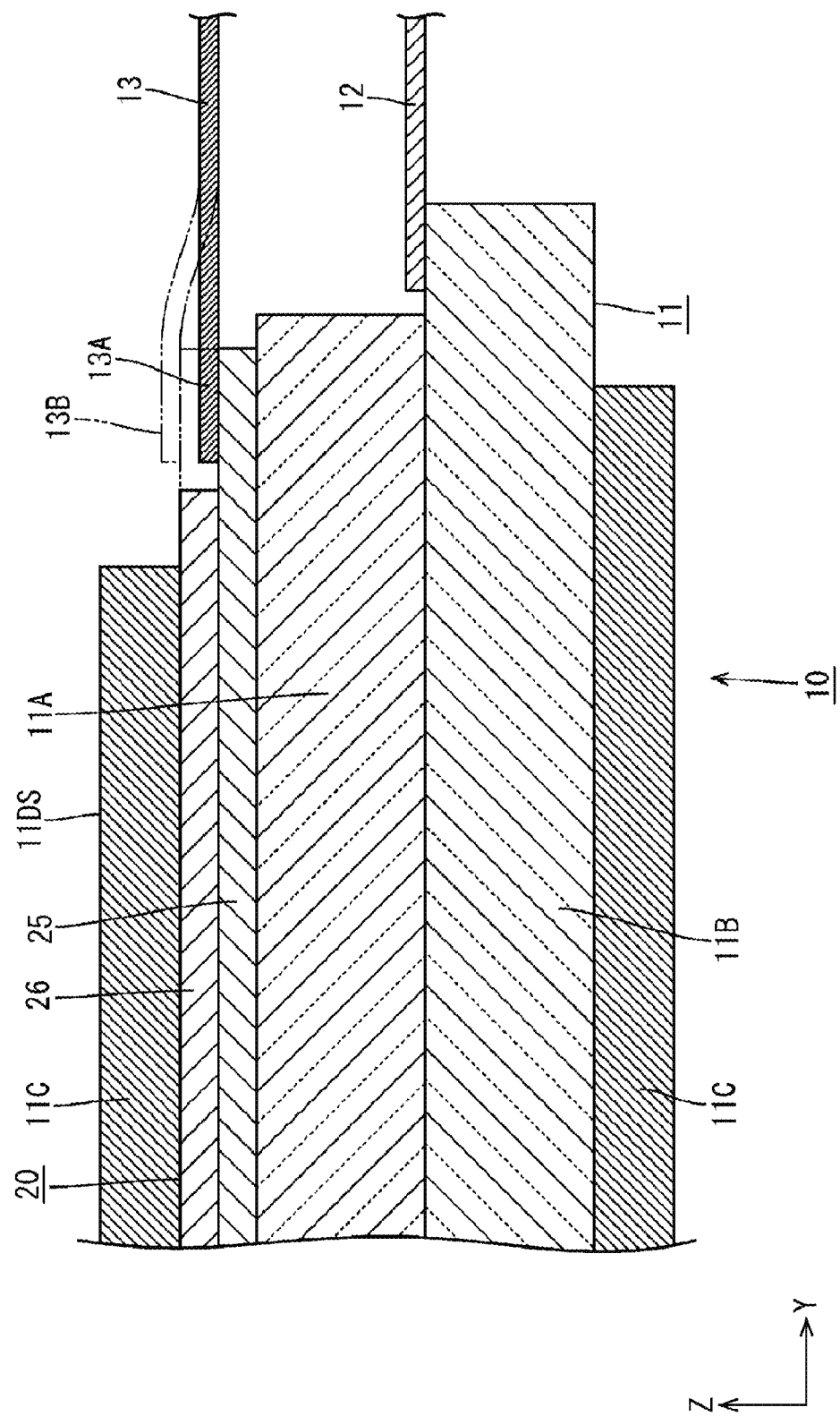
FIG. 2 is a cross-sectional view of a liquid crystal panel and a touch panel.

First, a configuration of the liquid crystal display device 10 is described. As shown in FIGS. 1 and 2, the liquid crystal display device 10 has a horizontally long square shape as a whole, and includes at least a liquid crystal panel (display panel having a position input function) 11 including as a front plate surface a display surface 11DS that is capable of displaying an image, a display flexible substrate 12 connected to the liquid crystal panel 11, a backlight device (not illustrated) that illuminates the liquid crystal panel 11 with illuminating light for display, a touch panel (circuit board, position input device) 20 for detecting a position (input position) that a user inputs, and a touch panel flexible substrate 13 connected to the touch panel 20. The liquid crystal display device 10 according to the present embodiment has a size that is typically classified as a larger size or an extra-large size, as the liquid crystal panel 11 has a screen size of, for example, approximately 70 to 100 inches.

As shown in FIG. 2, the liquid crystal panel 11 includes a pair of substantially transparent substrates 11A and 11B bonded together at a predetermined spacing (cell gap) from each other and liquid crystals sealed in between the two substrates 11A and 11B. Of the pair of substrates 11A and 11B, the array substrate (active matrix substrate) 11B, placed at the back, is provided with structures such as switching elements (e.g. TFTs) connected to source lines and gate lines that are orthogonal to each other, pixel electrodes connected to the switching elements, and an alignment film. The array substrate 11B has a glass substrate on which the aforementioned various structures are formed. Meanwhile, the CF substrate (counter substrate) 11A, placed at the front, is provided with structures such as a counter electrode and an alignment film in addition to being provided with a color filter in which colored portions such as R (red), G (green), and B (blue) colored portions are arranged in a predetermined array and a light shield (black matrix) that partitions adjacent colored portions from each other. A pair of front and back polarizing plates 11C are placed beside the outer surfaces of the pair of substrates 11A and 11B, respectively. The back polarizing plate 11C is pasted directly to the outer surface of the array substrate 11B, and the front polarizing plate 11C is pasted to the outer surface of the CF substrate 11A via the touch panel 20. That is, the front polarizing plate 11C is disposed so that the touch panel 20 is sandwiched between the front polarizing plate 11C and the CF substrate 11A. The polarizing plate 11C placed at the forefront of the liquid crystal panel 11 has a surface that constitutes the display surface 11DS. Further, the two substrates 11A and 11B are each made of glass having a thickness of, for example, approximately 0.57 mm.

As shown in FIG. 1, the CF substrate 11A is shorter in short-side dimension than the array substrate 11B, and is bonded to the array substrate 11B in such a manner that one end of the CF substrate 11A in a short-side direction meets one end of the array substrate 11B in the short-side direction. Accordingly, the other end of the array substrate 11B in the short side direction (Y-axis direction) projects laterally with respect to the CF substrate 11A, and to the projecting portion, the display flexible substrate 12, which is described next, is connected. The display surface 11DS of the liquid crystal panel 11 is divided into a display area (active area) AA where an image is displayed and a non-display area (non-active area) NAA, formed in the shape of a frame surrounding the display area AA, where no image is displayed. In FIG. 1, the dot-and-dash lines indicate the outer shape of the display area AA, and the area outside the dot-and-dash lines is the non-display area NAA.

As shown in FIGS. 1 and 2, the display flexible substrate 12 and the touch panel flexible substrate 13 have flexibility by including film base members each made of a synthetic resin material (such as polyimide resin), and have large numbers of wiring patterns (not illustrated) on the base members. The display flexible substrate 12 has a first end connected to the array substrate 11B of the liquid crystal panel 11 and a second end connected to a control substrate (not illustrated) serving as a signal supply source, thus making it possible to transmit, to the array substrate 11B, signals and the like pertaining to image display that are supplied from the control substrate. Meanwhile, the touch panel flexible substrate 13 has a first end connected to the touch panel 20 provided on the CF substrate 11A of the liquid crystal panel 11 and a second end connected to the control substrate (not illustrated), thus making it possible to transmit, to the touch panel 20, signals and the like pertaining to position detection that are supplied from the control substrate. The touch panel 20 and the array substrate 11B have their ends provided with terminal areas that are connected to an end of the touch panel flexible substrate 13 and an end of the display flexible substrate 12, respectively.

Figure 3:
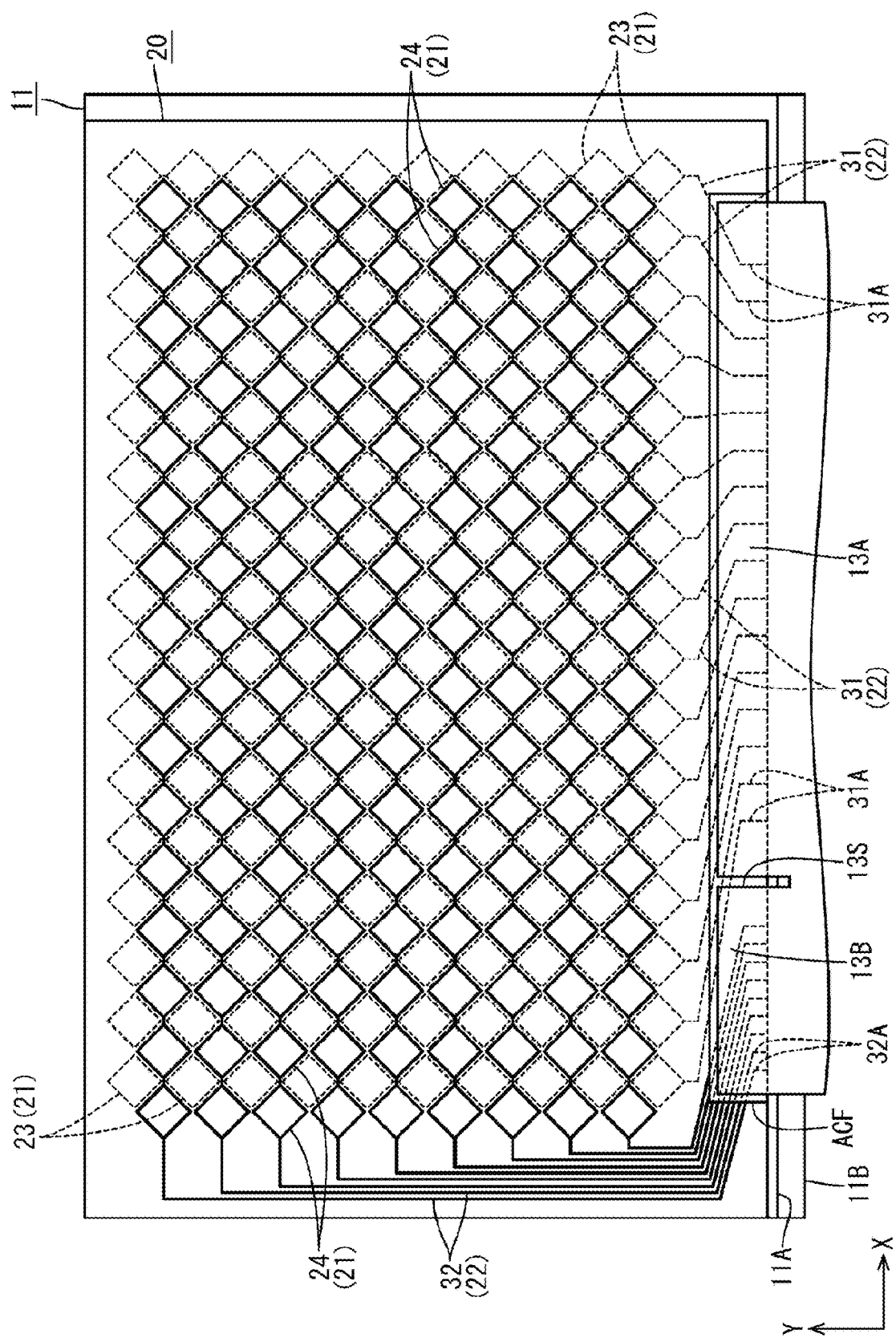
FIG. 3 is a plan view of the liquid crystal panel and the touch panel and a plan view schematically showing a touch panel pattern.

As already mentioned, the liquid crystal panel 11 according to the present embodiment has both a display function of displaying an image and a touch panel function (position input function) of detecting a position (input position) that a user inputs on the basis of an image that is displayed, and is integrated (by on-cell technology) with the touch panel 20 including a touch panel pattern for fulfilling the touch panel function. As shown in FIG. 2, the touch panel 20 is provided in such a manner as to overlap the front side of the CF substrate 11A of the liquid crystal panel 11. The touch panel pattern of the touch panel 20 adopts a so-called projection capacitive scheme, and a detection scheme of the touch panel pattern is a mutual capacitance scheme. As shown in FIG. 3, the touch panel pattern includes at least a plurality of touch electrodes (position detecting electrodes) 21 arranged in a matrix in a plane of the touch panel 20. The touch electrodes 21 is placed in an area of the touch panel 20 that overlaps the display area AA of the liquid crystal panel 11. Accordingly, the display area AA of the liquid crystal panel 11 substantially corresponds to a touch area where an input position can be detected, and the non-display area NAA substantially corresponds to a non-touch area where an input position cannot be detected. Further, in the non-touch area, the touch panel 20 is provided with peripheral wires 22 having first ends connected to the touch electrodes 21 and second ends connected to the terminal area connected to the touch panel flexible substrate 13. Moreover, when a user moves his/her finger (position input body; not illustrated), which is a conductor, nearer to the touch panel 20 in an attempt to input a position on the basis of an image on the display area AA that he/she views, electrostatic capacitances are formed between the finger and the touch electrodes 21. As a result, an electrostatic capacitance that is detected by a touch electrode 21 located near the finger changes with the approach of the finger and becomes different from that which is detected by a touch electrode 21 located far away from the finger. This makes it possible to detect an input position on the basis of the difference.

In particular, as shown in FIG. 3, the touch electrodes 21 include a plurality of first touch electrodes (first position detecting electrodes) 23 linearly arranged along the Y-axis direction (first direction) and a plurality of second touch electrodes (second position detecting electrodes) 24 linearly arranged along the X-axis direction (second direction) orthogonal to the Y-axis direction. The first touch electrodes 23 and the second touch electrodes 24 are substantially rhomboidal in planar shape, and are disposed in such a manner as to planarly fill the touch area in a plate surface of the touch panel 20, i.e. in such a manner as not to overlap each other. Further, the first touch electrodes 23 and the second touch electrodes 24 have diagonal dimensions of, for example, approximately 5 mm in size. First touch electrodes 23 that are adjacent to each other in the Y-axis direction have their mutually adjacent ends connected to each other, whereby a plurality of first touch electrodes 23 arranged in a column along the Y-axis direction are electrically connected to each other to constitute a columnar group of first touch electrodes 23 along the Y-axis direction, and this group of first touch electrodes 23 makes it possible to detect an input position with respect to the Y-axis direction. In the touch area of the touch panel 20, a plurality of the groups of first touch electrodes 23 are placed side by side at spacings in the X-axis direction. Second touch electrodes 24 that are adjacent to each other in the X-axis direction have their mutually adjacent ends connected to each other, whereby a plurality of second touch electrodes 24 arranged in a column along the X-axis direction are electrically connected to each other to constitute a columnar group of second touch electrodes 24 along the X-axis direction, and this group of second touch electrodes 24 makes it possible to detect an input position with respect to the X-axis direction. In the touch area of the touch panel 20, a plurality of the groups of second touch electrodes 24 are placed side by side at spacings in the Y-axis direction. This makes it possible to identify an input position with respect to the X-axis direction and the Y-axis direction.

Figure 4:
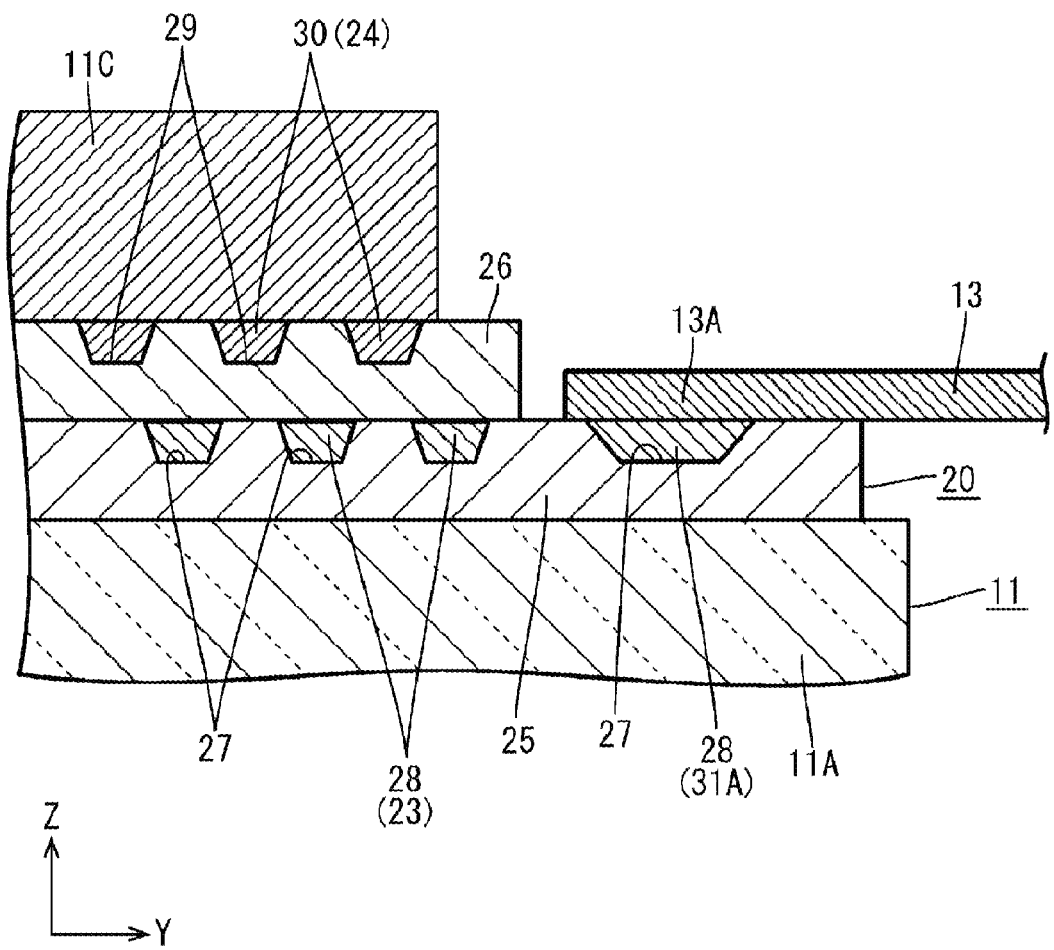
FIG. 4 is a cross-sectional view of a portion of the liquid crystal panel, the touch panel, and a touch panel flexible substrate.

Places of connection between first touch electrodes 23 in the group of first touch electrodes 23 and places of connection between second touch electrodes 24 in the group of second touch electrodes 24 are disposed to overlap (cross) each other, but are placed at different levels from each other for mutual insulation (short-circuit prevention). In particular, as shown in FIG. 4, the touch panel 20 includes a stacking of a first imprint layer, provided with the first touch electrodes 23, that is insulative and a second imprint layer 26, provided with the second touch electrodes 24, that is insulative. The first imprint layer 25 is placed relatively at the back, i.e. on the side of the CF substrate 11A, and the second imprint layer 26 is placed relatively at the front, i.e. on the side of the front polarizing plate 11C. The first imprint layer 25 and the second imprint layer 26 are both made of an ultraviolet-curable resin material and each have a thickness of, for example, 10 μm. The first imprint layer 25 and the second imprint layer 26 are stacked in a solidly spread state substantially all over the CF substrate 11A of the liquid crystal panel 11, on which the touch panel 20 is installed. The first imprint layer 25 is provided with first wire forming groove portions 27 formed by partially depressing the front side of the first imprint layer 25 (i.e. a side of the first imprint layer 25 opposite to the CF substrate 11A) and first wires 28, placed in the first wire forming groove portions 27, that constitute the first touch electrodes 23 and the like. Similarly, the second imprint layer 26 is provided with second wire forming groove portions 29 formed by partially depressing the front side of the second imprint layer 26 (i.e. a side of the second imprint layer 26 opposite to the first imprint layer 25) and second wires 30, placed in the second wire forming groove portions 29, that constitute the second touch electrodes 24 and the like. The first wire forming groove portions 27 and the second wire forming groove portions 29 are provided in the surfaces of the first and second imprint layers 25 and 26, respectively, by a so-called imprint method. The first wire forming groove portions 27 and the second wire forming groove portions 29 have groove depths approximately slightly less than half as great as the thicknesses of the first and second imprint layers 25 and 26, respectively (i.e. smaller than the thickness of the after-mentioned spacer layer 33), and, specifically, have groove depths of, for example, approximately less than 5 μm. The first wires 28 and the second wires 30 are formed by drying and curing metal ink (such as silver nanoink) containing a highly-conductive metal material (such as silver) as a major material. For securement of flatness, it is preferable that the first and second wires 28 and 30 formed in the first and second wire forming groove portions 27 and 29 have their outer surfaces flush with the outermost surfaces of the first and second imprint layers 25 and 26, respectively. However, this is not necessarily intended to impose any limitation.

Figure 5:
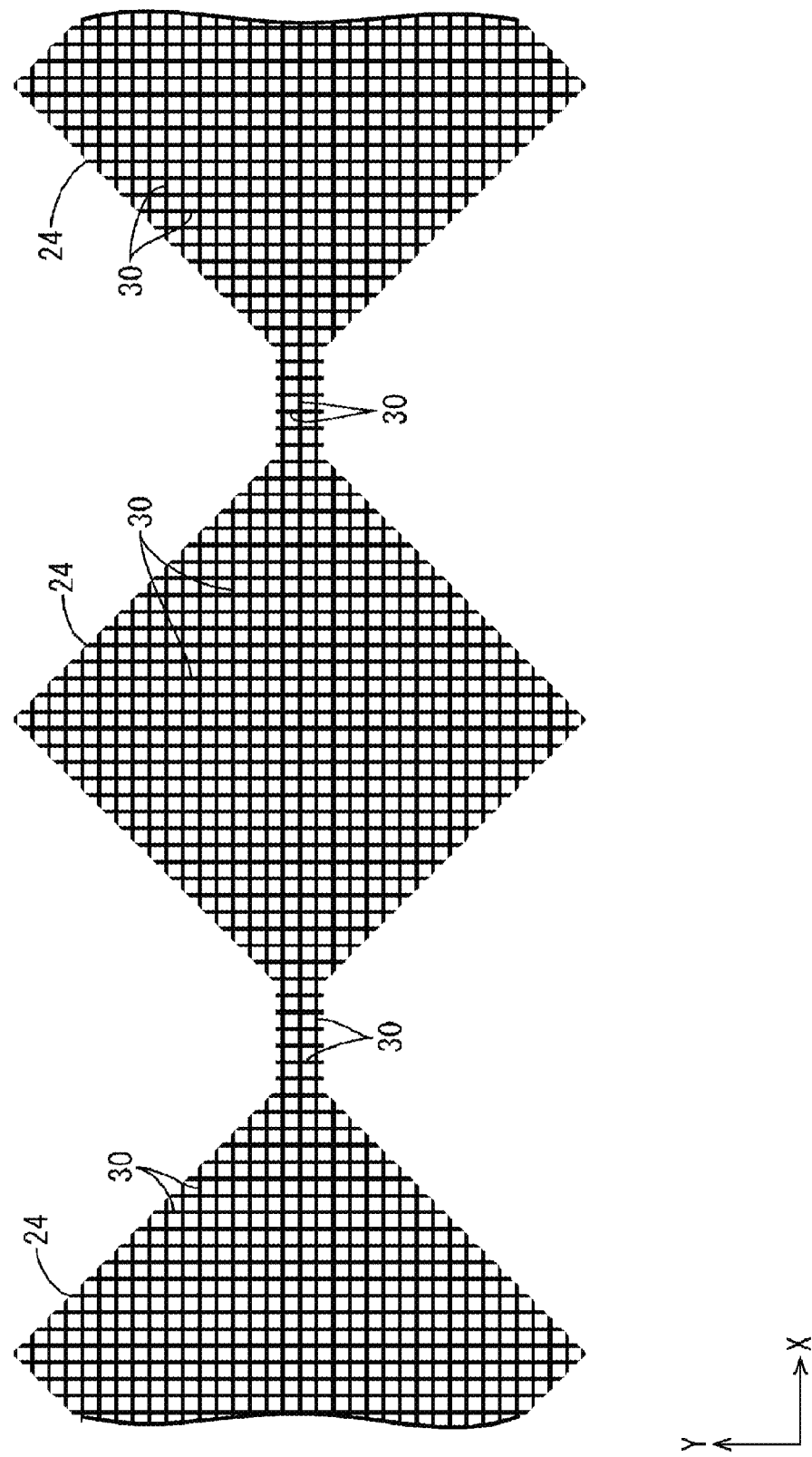
FIG. 5 is an enlarged plan view of second touch electrodes constituting the touch panel pattern.

As shown in FIG. 5, the first wires 28 and the second wires 30 have line widths of, for example, approximately 3 μm, which is much smaller than the outer dimensions (approximately 5 mm) of the first touch electrodes 23 and the second touch electrodes 24, and include those which linearly extend along the X-axis direction and those which linearly extend along the Y-axis direction. Although FIG. 5 representatively illustrates second touch electrodes 24 composed of second wires 30, the first touch electrodes 23 composed of the first wires 30 too are configured in a similar manner. Large numbers of first and second wires 28 and 30 that linearly extend along the X-axis direction are arranged parallel to each other at spacings in the Y-axis direction, and large numbers of first and second wires 28 and 30 that linearly extend along the Y-axis direction are arranged parallel to each other at spacing in the X-axis direction, whereby the group of first wires 28 and the group of second wires 30 are routed in a netlike (mesh) pattern in ranges of formation of the first and second touch electrodes 23 and 24. Further, first wires 28 crossing each other is electrically short-circuited, and second wires 30 crossing each other is electrically short-circuited. This makes it easy for light to pass through the first touch electrodes 23 and the second touch electrodes 24 in the touch area of the touch panel 20, thereby making it possible to attain a sufficient display luminance of an image on the display area AA of the liquid crystal panel 11. In this way, the first wires 28 and the second wires 30, albeit fine, have their ranges of formation defined in advance by the first wire forming groove portions 27 and the second wire forming groove portions 29, respectively; therefore, the first and second wires 28 and 30, which are fine, can be placed in appropriate positions in the plane of the touch panel 20. The first and second wire forming groove portions 27 and 29, in which the first and second wires 28 and 30 are placed, respectively, include large numbers of those which linearly extend along the X-axis direction and large numbers of those which linearly extend along the Y-axis direction as is the case with the first and second wires 28 and 30, and form a grid pattern, and those crossing each other communicate with each other.

As shown in FIG. 3, the peripheral wires 22 are constituted by first peripheral wires 31 placed in a non-touch area of the first imprint layer 25 and constituted by the first wires 28 and second peripheral wires 32 placed in a non-touch area of the second imprint layer 26 and constituted by the second wires 30. The first peripheral wires 31 are routed in fan-like fashion toward a mounting area of the touch panel flexible substrate 13 from lower ends, shown in FIG. 3, of the groups of first touch electrodes 23 that extend along the Y-axis direction. The second peripheral wires 32 are routed toward the mounting area of the touch panel flexible substrate 13 from left ends, shown in FIG. 3, of the groups of second touch electrodes 24 that extend along the X-axis direction. The first peripheral wires 31 and the second peripheral wires 32 have first and second terminal areas 31A and 32A, respectively, placed in the mounting area of the touch panel flexible substrate 13, that are electrically connected via an anisotropic conductive film ACF to the terminal area of the touch panel flexible substrate 13. A plurality of the first terminal areas 31A are placed side by side at spacings along the X-axis direction in a large portion of the mounting area of the touch panel flexible substrate 13 shown on the right side of FIG. 3. A plurality of the second terminal areas 32A are placed side by side at spacings along the X-axis direction in a portion of the mounting area of the touch panel flexible substrate 13 shown on the left side of FIG. 3 (i.e. the side to which the second peripheral wires 32 are drawn from the groups of second touch electrodes 24). These first and second peripheral wires 31 and 32 are placed in the non-touch area of the touch panel 20, i.e. the non-display area NAA of the liquid crystal panel 11. Accordingly, portions of the first and second wires 28 and 30 (first and second wire forming groove portions 27 and 29) that constitute the first and second peripheral wires 31 and 32 do not necessarily need to be formed in a netlike pattern like portions of the first and second wires 28 and 30 that constitute the first and second touch electrodes 23 and 24 and, for example, may be formed with the same width as the first and second peripheral wires 31 and 32.

Further, as shown in FIG. 4, the second touch electrodes 24 and the second peripheral wires 32, which are placed in the foremost surface of the touch panel 20, are substantially entirely covered with the front polarizing plate 11C pasted to the front side of the touch panel 20. This polarizing plate 11C prevents the second touch electrodes 24 and the second peripheral wires 32 from being exposed to the outside, thereby achieving protection of the second touch electrodes 24 and the second peripheral wires 32.

Incidentally, in the touch panel 20 according to the present embodiment, as shown in FIG. 4, a range of formation of the second imprint layer 26 is narrower than a range of formation of the first imprint layer 25. In particular, the second imprint layer 26 selectively does not have a portion that overlaps a range of formation of the first terminal area 31A in the first imprint layer 25, and this portion is locally notched. In the after-mentioned process of manufacturing the touch panel 20, the second imprint layer 26 has a range of formation which is equal to that of the first imprint layer 25; however, in the last stage of manufacturing, a portion of the second imprint layer 26 that overlaps the range of formation of the first terminal area 31A is selectively removed. This causes the first terminal area 31A formed in the first imprint layer 25 to be exposed to the outside without being covered with the second imprint layer 26, thus making it possible to connect the terminal area of the touch panel flexible substrate 13 to the first terminal area 31A. There is a difference in level corresponding to the thickness of the second imprint layer 26 between the first terminal area 31A formed in the first imprint layer 25 and the second terminal area 32A formed in the second imprint layer 26; however, as shown in FIG. 3, the difference in level can be absorbed to a certain degree by the anisotropic conductive film ACF sandwiched between the first and second terminal areas 31A and 32A and the touch panel flexible substrate 13. In addition to that, a slit 13S cut between a first terminal overlap region 13A of the touch panel flexible substrate 13 that overlaps the first terminal area 31A and a second terminal overlap region 13B of the touch panel flexible substrate 13 that overlaps the second terminal area 32A allows the two overlap regions 13A and 13B to differ in position with respect to the Z-axis direction according to the difference in level, thereby making it possible to absorb the difference in level.

The liquid crystal display device 10 according to the present embodiment is structured as described above, and next, a method for manufacturing a touch panel 20 of a liquid crystal panel 11 of a liquid crystal display device 10 is described. The method for manufacturing a touch panel 20 includes: a first imprint layer forming step of forming a first imprint layer 25 on an outer surface of a CF substrate 11A; a first groove portion forming step (first imprint step) of forming a first wire forming groove portion 27 by partially depressing a surface of the first imprint layer 25; a first wire forming step of forming a first wire 28 in the first wire forming groove portion 27; a spacer layer forming step of forming a spacer layer 33 on a front side of the first imprint layer 25 so that the spacer layer 33 overlaps a part of the fire wire 28; a second imprint layer forming step of forming a second imprint layer 26 so that the spacer layer 33 is sandwiched between the first imprint layer 25 and the second imprint layer 26; a second groove portion forming step (second imprint step) of forming a second wire forming groove portion 29 by partially depressing a surface of the second imprint layer 26; a second wire forming step of forming a second wire 30 in the second wire forming groove portion 29; and a spacer layer delaminating step of delaminating the spacer layer 33 from the first imprint layer 25.

Figure 6:
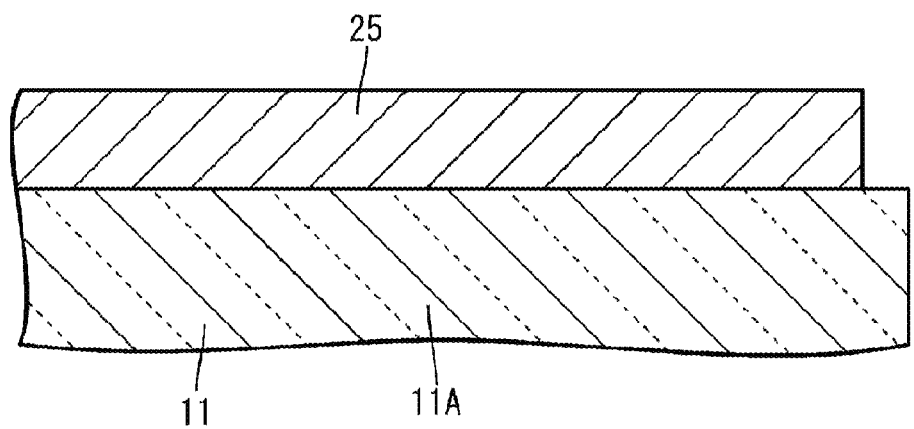
FIG. 6 is a cross-sectional view showing a state where a first imprint layer has been formed on a CF substrate in a first imprint layer forming step of a method for manufacturing a touch panel.

In the first imprint layer forming step, as shown in FIG. 6, a first imprint layer 25 made of an ultraviolet-curable resin material (hardening resin material, photo-curable resin material) is formed on the outer plate surface of a CF substrate 11A of a liquid crystal panel 11. At this point in time, the ultraviolet-curable resin material of which the first imprint layer 25 is to be made is applied with a uniform film thickness onto the surface of the CF substrate 11A by using a coating applicator such as a roll coater or a spin coater (spinner). In this stage, the ultraviolet-curable resin material of which the first imprint layer 25 is to be made is in an uncured state. Next, in the first groove portion forming step, as shown in FIG. 7(A), a first imprint block (first pattern mask, first transfer block) 34 is pressed against a surface of the first imprint layer 25 uncured. The first imprint block 34 has fine projections 34A formed by transferring the shapes of first wire forming groove portions 27 onto a contact surface (molding surface) of the first imprint block 34 that makes contact with the first imprint layer 25. Accordingly, when the first imprint block 34 is pressed against the first imprint layer 25, the projections 34A bite into portions of the first imprint layer 25 so that the portions become depressed. By irradiating the first imprint layer 25 with ultraviolet rays in this state, the ultraviolet-curable resin material of the first imprint layer 25 is cured. After that, the first imprint block 34 is delaminated from the first imprint layer 25. Then, as shown in FIG. 7(B), the portions of the first imprint layer 25 into which the projections 34A of the first imprint block 34 have bitten turn into first wire forming groove portions 27.

That is, by the first imprint block 34 being transferred to the first imprint layer 25, the first wire forming groove portions 27 are formed.

Figure 9:
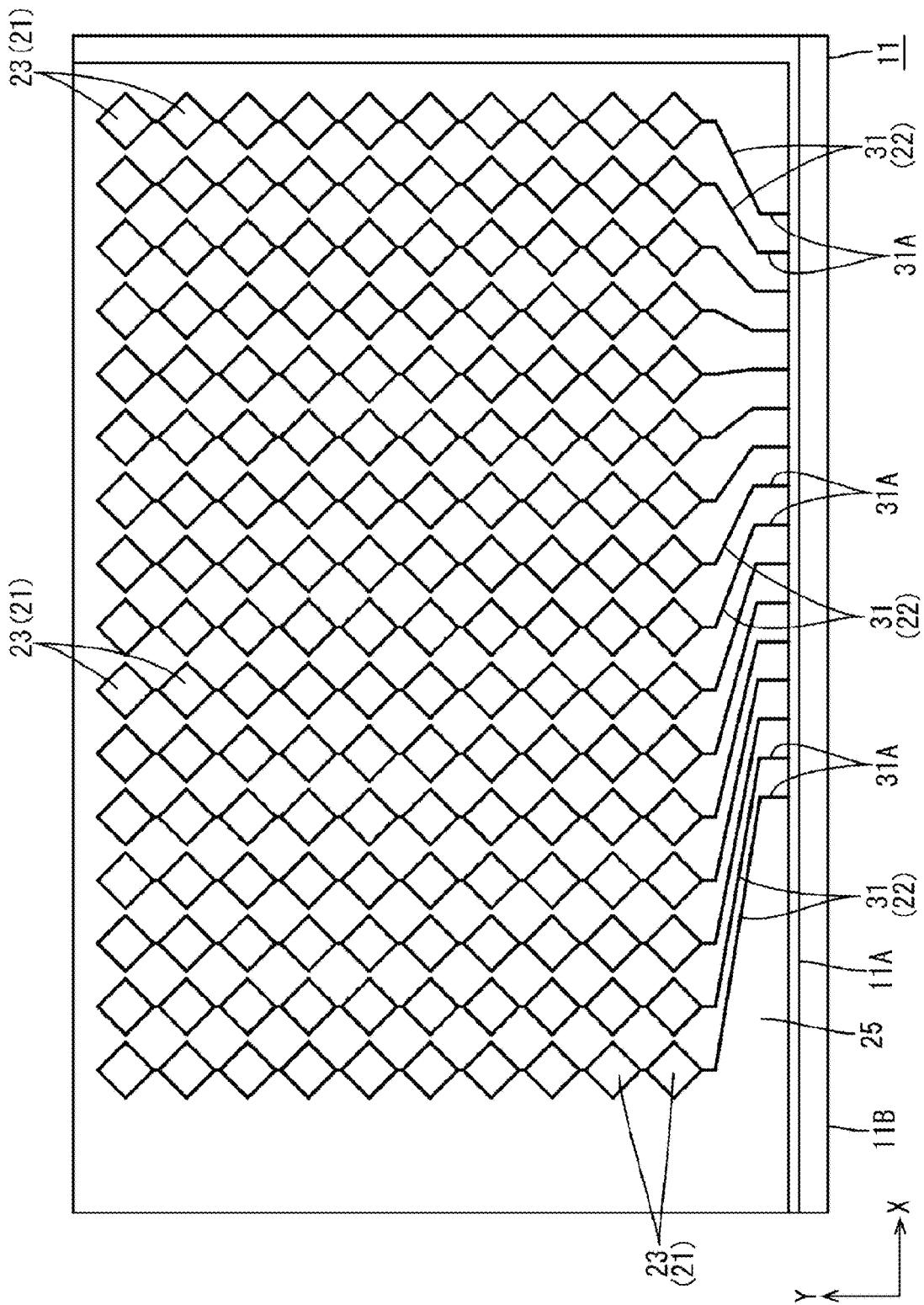
FIG. 9 is a plan view showing the first imprint layer with the first wires formed therein in the first wire forming step.

In the first wire forming step, as shown in FIG. 8(A), a material 28M of first wires 28 is applied onto the surface of the first imprint layer 25 in which the first wire forming groove portions 27 have been formed. The material 28M of the first wires 28 has good fluidity and the like by being metal nanoink obtained by dissolving and dispersing nanoparticles of a metal material such as silver in a solvent composed of water, alcohol, and the like. Applied onto the surface of the first imprint layer 25, the material 28M of the first wires 28 fills the first wire forming groove portions 27 and is placed outside the first wire forming groove portions 27. After that, a squeegee 35 is slid along the surface of the first imprint layer 25. Then, as shown in FIG. 8(B), a portion of the material 28M of the first wires 28 that is present on a part of the surface of the first imprint layer 25 located outside the first wire forming groove portions 27 is removed by the squeegee 35, but portions of the material 28M of the first wires 28 that are present in the first wire forming groove portions 27 remain without being removed by the squeegee 35. Further, even if a large number of the first wire forming groove portions 27 have their internal spaces unfilled with the material 28M of the first wires 28, the internal spaces are filed with a portion of the material 28M of the first wires 28 that has been collected from outside the first wire forming groove portions 27 by the squeegee 35. As a result, all of the first wire forming groove portions 27 are filled with the material 28M of the first wires 28. After that, the solvent contained in the material 28M of the first wires 28 is evaporated by a dryer, whereby the first wires 28 are formed in the first wire forming groove portions 27. In this way, as shown in FIG. 9, first touch electrodes 23 and first peripheral wires 31 (including first terminal areas 31A) that are composed of the first wires 28 are patterned into the surface of the first imprint layer 25. The dryer is set to a drying temperature falling within a range of, for example, 100 to 120° C., and at a processing temperature that is lower than in a photolithography step or a deposition step that is executed in the process of manufacturing the liquid crystal panel 11, adverse effects on the structures (such as the color filter, the light shield, the TFTs, and the pixel electrodes) provided inside the liquid crystal panel 11 are avoided.

Figure 10:
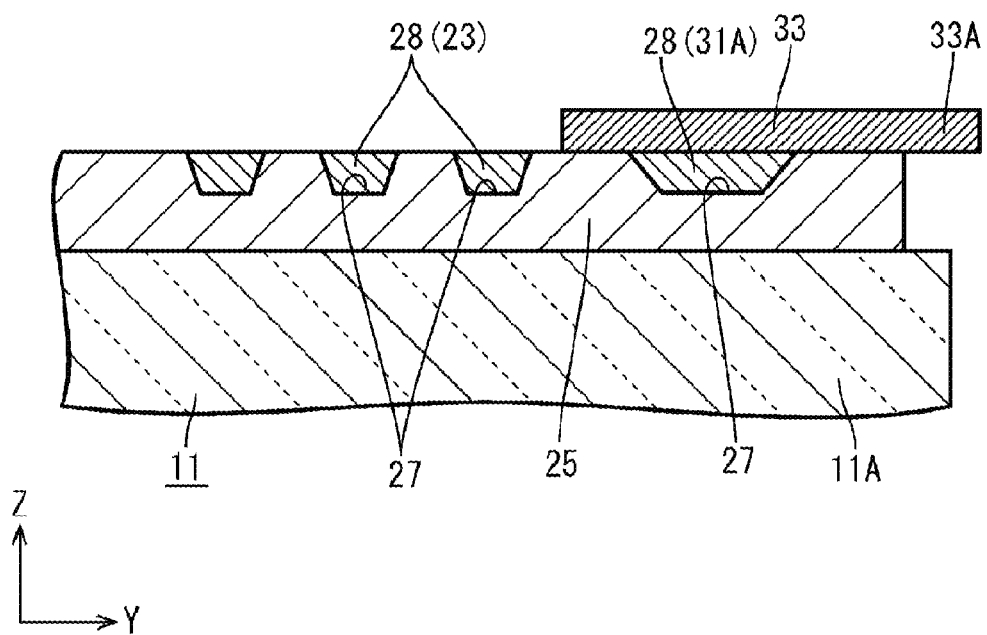
FIG. 10 is a cross-sectional view showing a state where a spacer layer has been formed on the first imprint layer in a spacer layer forming step of the method for manufacturing a touch panel.
Figure 11:
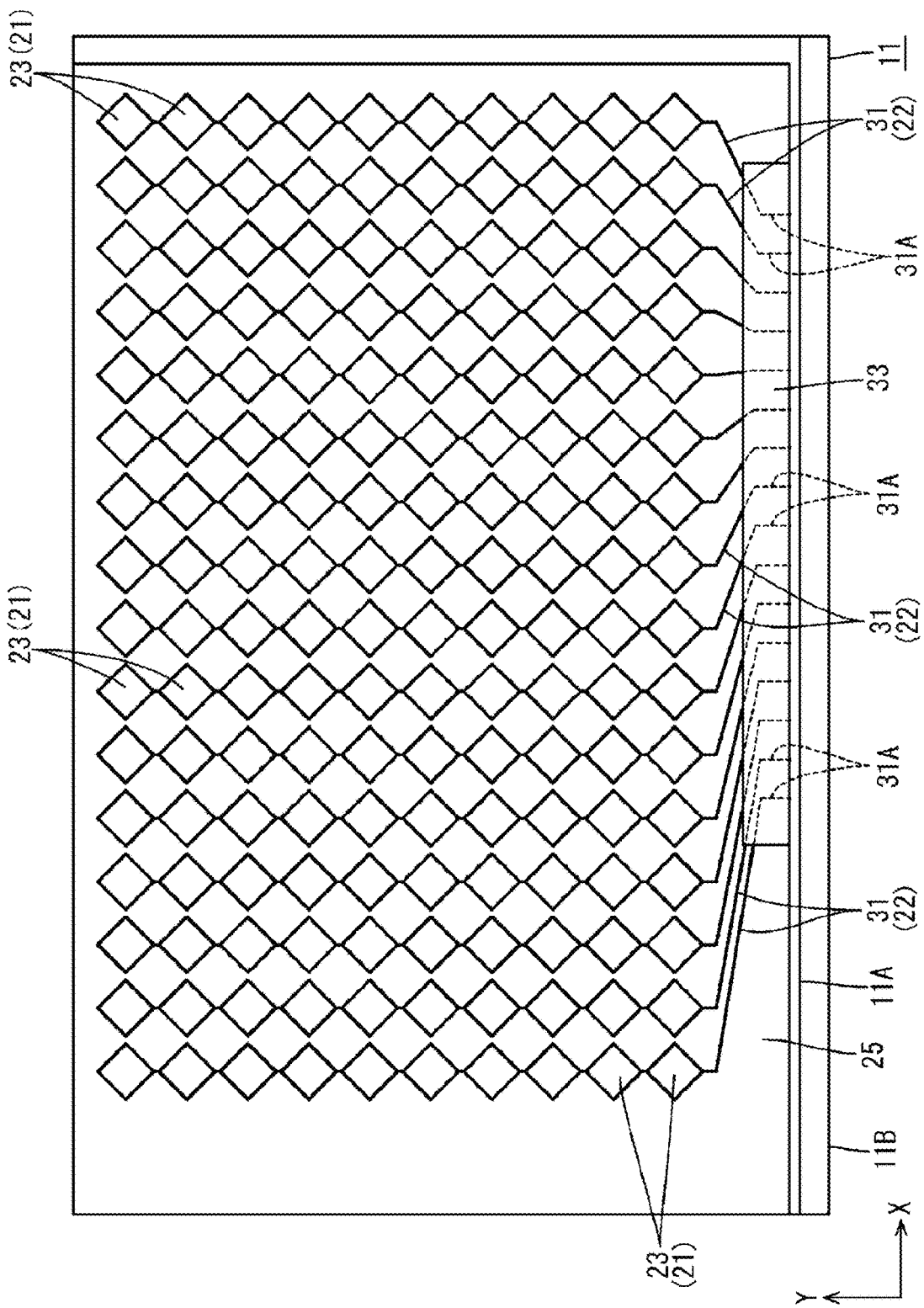
FIG. 11 is a plan view showing a state where the spacer layer has been formed on the first imprint layer in the spacer layer forming step.

In the spacer layer forming step, as shown in FIGS. 10 and 11, a spacer layer 33 is formed so as to overlap the front surface of the first imprint layer 25, i.e. the surface of the first imprint layer 25 in which the first wire forming groove portions 27 have been formed. At this point in time, the spacer layer 33 has been formed so as to partially overlap the first peripheral wires 31, which are parts of the first wires 28, and selectively overlap the entirety of at least the first terminal areas 31A. The spacer layer 33 is made of a substantially transparent and highly translucent synthetic resin material (such as PET) with a thickness smaller than that of the second imprint layer 26 or, specifically, a thickness of, for example, approximately 5 µm (which is about half the thickness of the second imprint layer 26). Further, the spacer layer 33 is firmly fixed to the first imprint layer 25 by an adhesive layer (not illustrated). Formed through the spacer layer forming step, the spacer layer 33 has its end 33A projecting laterally from an outer end of the first imprint layer 25.

Figure 12:
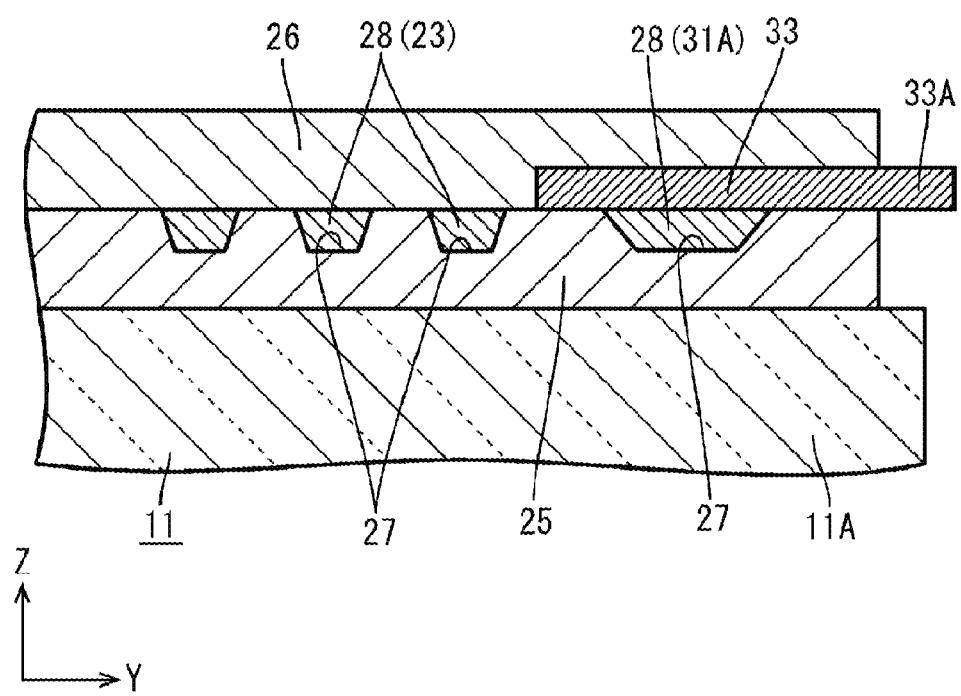
FIG. 12 is a cross-sectional view showing a state where a second imprint layer has been formed on the first imprint layer and the spacer layer in a second imprint layer forming step of the method for manufacturing a touch panel.

In the second imprint layer forming step, as shown in FIG. 12, a second imprint layer 26 made of an ultraviolet-curable resin material (hardening resin material, photo-curable resin material) is formed on the front surfaces of the first imprint layer 25 and the spacer layer 33. The second imprint layer 26 is applied by a method which is similar to that by which the first imprint layer 25 was applied. The second imprint layer 26 is formed in such a manner that the spacer layer 33 is sandwiched between the first imprint layer 25 and the second imprint layer 26. Since the spacer layer 33 sandwiched between the first imprint layer 25 and the second imprint layer 26 is smaller in thickness than the second imprint layer 26, applying the ultraviolet-curable resin material, which is to constitute the second imprint layer 26, onto the first imprint layer 25 and the spacer layer 33 in the second imprint layer forming step allows the ultraviolet-curable resin material, which has fluidity, to be spread without forming a difference in level at the boundary between a portion of the ultraviolet-curable resin material that overlaps the spacer layer 33 and a portion of the ultraviolet-curable resin material that does not overlap the spacer layer 33. This prevents formation of a difference in level on a surface of the second imprint layer 26.

Next, in the second groove portion forming step, as shown in FIG. 13(A), a second imprint block (second pattern mask, second transfer block) 36 is pressed against a surface of the second imprint layer 26 (i.e. a surface of the second imprint layer 26 opposite to the first imprint layer 25) uncured. The second imprint block 36 has fine projections 36A formed by transferring the shapes of second wire forming groove portions 29 onto a contact surface of the second imprint block 36 that makes contact with the second imprint layer 26. Accordingly, when the second imprint block 36 is pressed against the second imprint layer 26, the projections 36A bite into portions of the second imprint layer 26 so that the portions become depressed. By irradiating the second imprint layer 26 with ultraviolet rays in this state, the ultraviolet-curable resin material of the second imprint layer 26 is cured. As already mentioned, the spacer layer 33, which overlaps a side of the second imprint layer 26 that faces the first imprint layer 25, is made of a translucent material; therefore, a portion of the second imprint layer 26 that overlaps the spacer layer 33 is satisfactorily irradiated with ultraviolet rays, whereby the second imprint layer 26 can be evenly cured. After that, the second imprint block 36 is delaminated from the second imprint layer 26. Then, as shown in FIG. 13(B), the portions of the second imprint layer 26 into which the projections 36A of the second imprint block 36 have bitten turn into second wire forming groove portions 29. That is, by the second imprint block 36 being transferred to the second imprint layer 26, the second wire forming groove portions 29 are formed.

Figure 15:
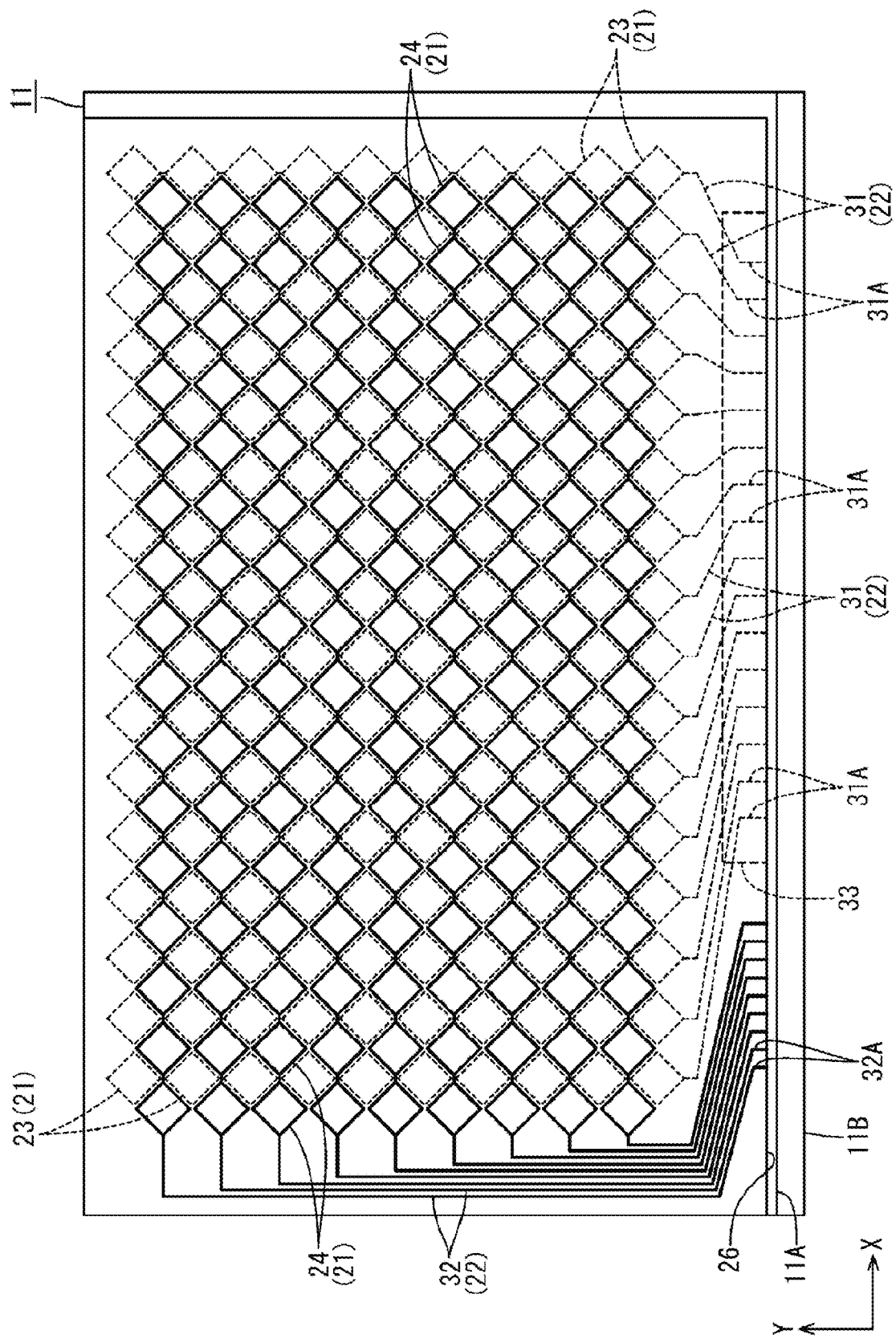
FIG. 15 is a plan view showing the second imprint layer with the second wires formed therein in the second wire forming step.

In the second wire forming step, as shown in FIG. 14(A), a material 30M of second wires 30 is applied onto the surface of the second imprint layer 26 in which the second wire forming groove portions 29 have been formed. The material 30M of the second wires 30 is similar to the material 28M of the first wires 28. As in the first wire forming step, a squeegee 37 is slid along the surface of the second imprint layer 26 to which the material 30M of the second wires 30 has been applied. Then, as shown in FIG. 14(B), a portion of the material 30M of the second wires 30 that is present on a part of the surface of the second imprint layer 26 located outside the second wire forming groove portions 29 is removed by the squeegee 37, but portions of the material 30M of the second wires 30 that are present in the second wire forming groove portions 29 remain without being removed by the squeegee 37. As a result, all of the second wire forming groove portions 29 are filled with the material 30M of the second wires 30. After that, as in the first wire forming step, the solvent contained in the material 30M of the second wires 30 is evaporated by a dryer, whereby the second wires 30 are formed in the second wire forming groove portions 29. In this way, as shown in FIG. 15, second touch electrodes 24 and second peripheral wires 32 (including second terminal areas 32A) that are composed of the second wires 30 are patterned into the surface of the second imprint layer 26.

Figure 16:
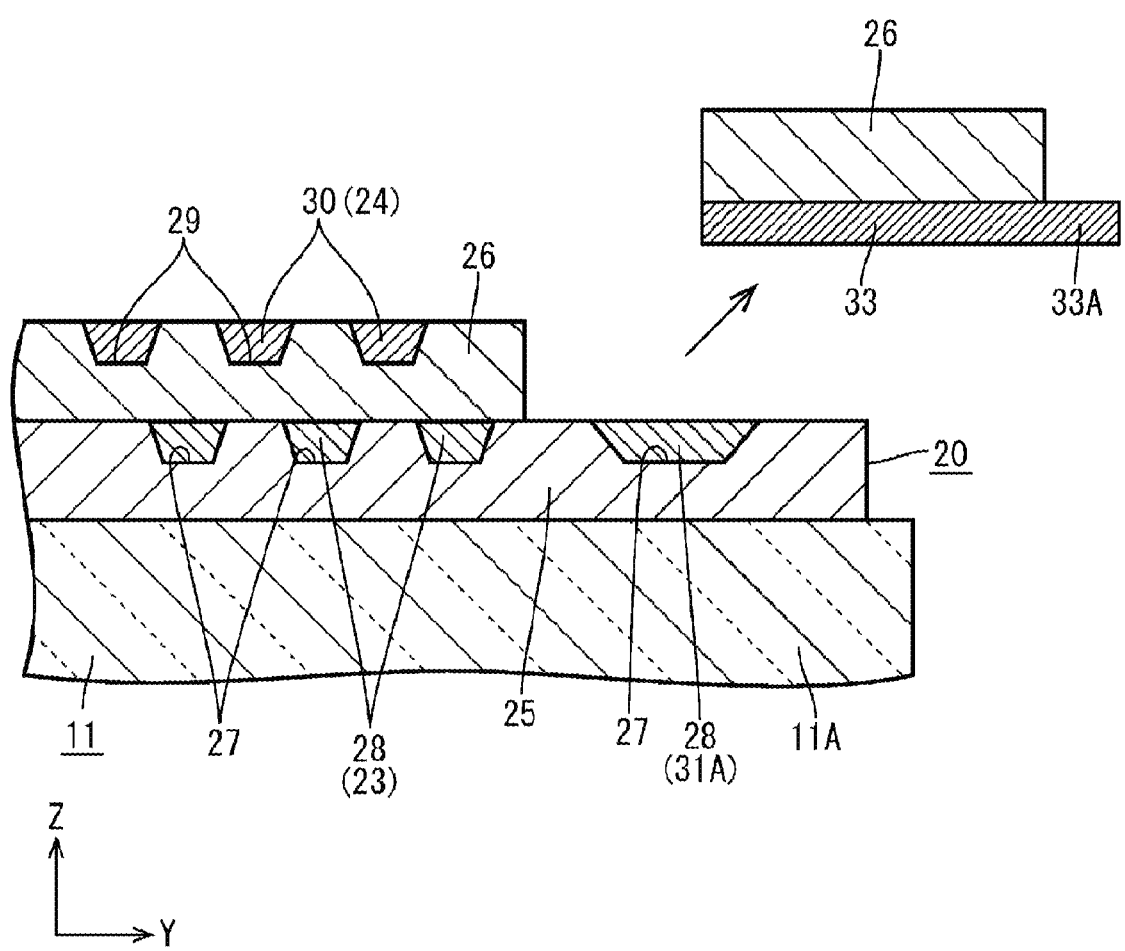
FIG. 16 is a cross-sectional view showing a state where the spacer layer has been removed together with a portion of the second imprint layer in a spacer layer delaminating step of the method for manufacturing a touch panel.
Figure 17:
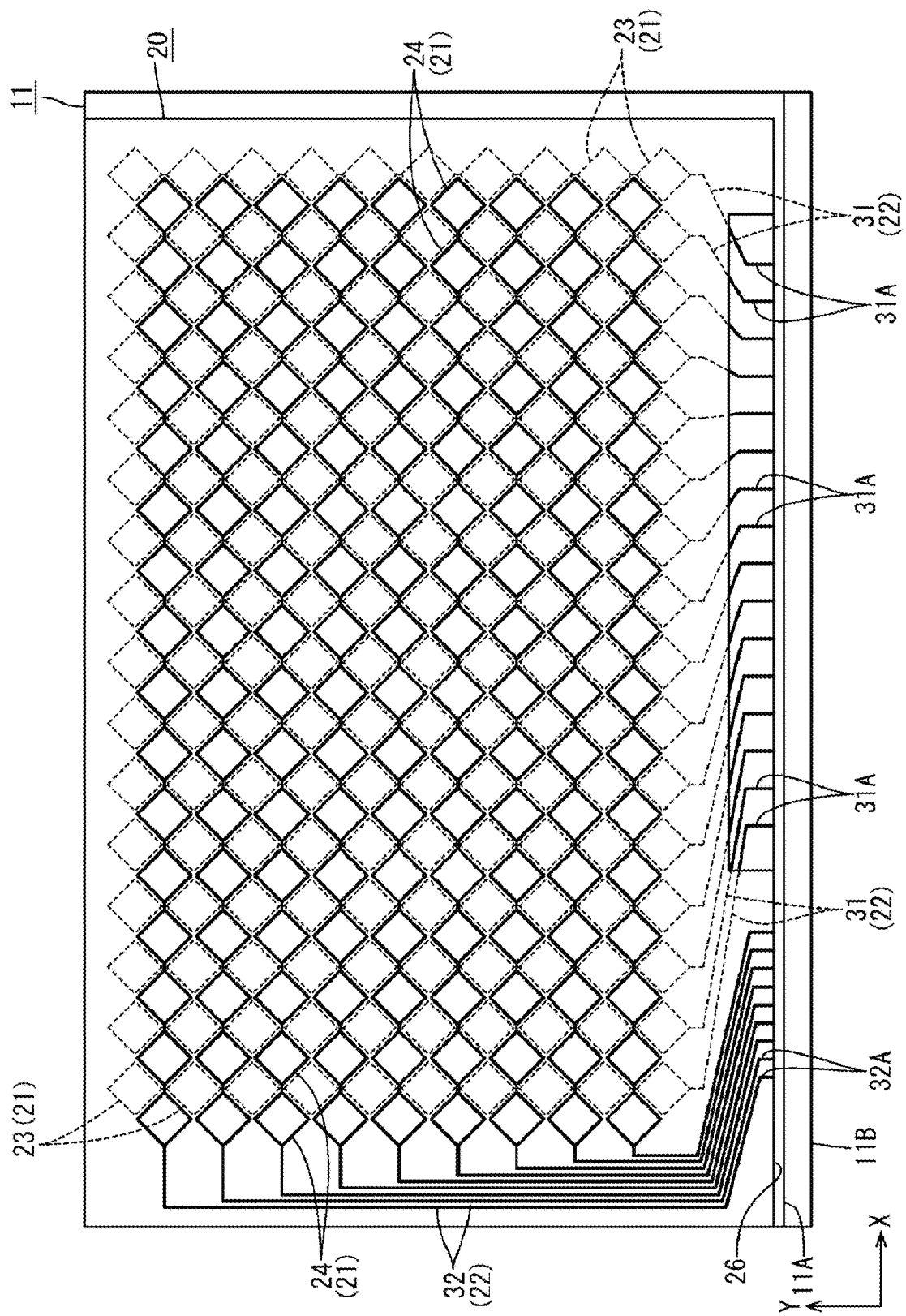
FIG. 17 is a plan view showing a state where the spacer layer has been removed together with a portion of the second imprint layer in the spacer layer delaminating step.

In the spacer layer delaminating step, as shown in FIGS. 16 and 17, the spacer layer 33 is delaminated from the first imprint layer 25. At this point in time, a delaminated portion of the spacer layer 33 from the first imprint layer 25 and a portion of the second imprint layer 26 that overlaps the delaminated portion are removed together. In particular, whereas a large portion of the second imprint layer 26 (i.e. a portion of the second imprint layer 26 in which at least the second wires 30 have been formed) is not delaminated and remains in a state of overlapping the first imprint layer 25, only a portion of the second imprint layer 26 that overlaps the spacer layer 33 and the first terminal areas 31A is selectively removed. As a result, the first terminal areas 31A, which are portions of the first wires 28 of the first imprint layer 25 that overlap the spacer layer 33, can be selectively exposed to the outside. This makes it possible to attach an anisotropic conductive film ACF to a range of formation of the first terminal areas 31A later and, furthermore, mount a touch panel flexible substrate 13. Conventionally, in order to prevent a portion of the first conductive layer that is to serve as a terminal from being covered with the second matrix layer, it is necessary to dispose the portion that is to serve as a terminal outside the assumed maximum range of formation of the second matrix layer, and this has caused the touchscreen to have an excessively wide frame width. On the other hand, the present embodiment makes it possible to selectively expose the first terminal areas 31A by delaminating and removing, together with a part of the second imprint layer 26, the spacer layer 33 sandwiched between the first imprint layer 25 and the second imprint layer 26, thus allowing the touch panel 20 to have a narrower frame width than in the conventional case and thereby suitably achieving a narrower frame. Moreover, since, in the spacer layer delaminating step, the spacer layer 33 is entirely delaminated from the first imprint layer 25, the spacer layer 33 can be delaminated from the first imprint layer 25 with better workability than if, in a spacer layer delaminating step, a portion of a spacer layer is delaminated while being separated from another portion of the spacer layer. Furthermore, since the spacer layer 33 has its end 33A projecting laterally from the outer end of the first imprint layer 25, a worker can easily hold, in the spacer layer delaminating step, the end 33A of the spacer layer 33 that projects laterally from the outer end of the first imprint layer 25. This improves the workability with which to delaminate the spacer layer 33.

As described above, a method for manufacturing a touch panel (circuit board) 20 according to the present embodiment includes: a first imprint layer forming step of forming a first imprint layer 25; a first groove portion forming step of forming a first wire forming groove portion 27 by partially depressing a surface of the first imprint layer 25; a first wire forming step of forming a first wire 28 in the first wire forming groove portion 27; a spacer layer forming step of forming a spacer layer 33 so that the spacer layer 33 is placed over the surface of the first imprint layer 25 in which the first wire forming groove portion 27 has been formed and overlaps a part of at least the first wire 28; a second imprint layer forming step of forming a second imprint layer 26 so that at least the spacer layer 33 is sandwiched between the first imprint layer 25 and the second imprint layer 26; a second groove portion forming step of forming a second wire forming groove portion 29 by partially depressing a surface of the second imprint layer 26 opposite to the first imprint layer 25; a second wire forming step of forming a second wire 30 in the second wire forming groove portion 29; and a spacer layer delaminating step of delaminating at least a part of the spacer layer 33 from the first imprint layer 25 and removing, together with the delaminated portion, a portion of the second imprint layer 26 that overlaps the delaminated portion.

First, in the first imprint layer forming step, a first imprint layer 25 is formed. In the first groove portion forming step, a first wire forming groove portion 27 is formed by partially depressing a surface of the first imprint layer 25. In the first wire forming step, a first wire 28 is formed in the first wire forming groove portion 27 of the first imprint layer 25. In the spacer layer forming step, a spacer layer 33 is formed so as to overlap the surface of the first imprint layer 25 in which the first wire forming groove portion 27 has been formed. The spacer layer 33 overlaps a part of at least the first wire 28. In the second imprint layer forming step, a second imprint layer 26 is formed in such a manner that at least the spacer layer 33 is sandwiched between the first imprint layer 25 and the second imprint layer 26. In the second groove portion forming step, a second wire forming groove portion 29 is formed by partially depressing a surface of the second imprint layer 26 opposite to the first imprint layer 25. In the second wire forming step, a second wire 30 is formed in the second wire forming groove portion 29 of the second imprint layer 26. In the spacer layer delaminating step, at least a part of the spacer layer 33 is delaminated from the first imprint layer 25. At this point in time, the delaminated portion of the spacer layer 33 and a portion of the second imprint layer 26 that overlaps the delaminated portion are removed. As a result, a part of the first wire 28 of the first imprint layer 25 can be exposed, so that the exposed portion of the first wire 28 can be utilized as a first terminal area (terminal) 31A or the like. This makes it possible to achieve a narrower frame width than in the conventional case where the touchscreen has a wider frame width so that a portion of the first conductive layer that is to serve as a terminal is prevented from being covered with the second matrix layer, thereby suitably achieving a narrower frame.

Further, in the spacer layer forming step, the spacer layer 33 is formed to have a range of formation that overlaps a part of the first wire 28, and in the spacer layer delaminating step, the spacer layer 33 is entirely delaminated from the first imprint layer 25. This makes it possible to delaminate the spacer layer 33 from the first imprint layer 25 with better workability than if, in a spacer layer delaminating step, a portion of a spacer layer is delaminated while being separated from another portion of the spacer layer.

Further, in the spacer layer forming step, the spacer layer 33 is formed so as to be thinner than the second imprint layer 26, and in the second imprint layer forming step, the second imprint layer 26 is formed by applying a hardening resin material onto the first imprint layer 25 and the spacer layer 33. In this way, since, in the spacer layer forming step, the spacer layer 33 is formed so as to be thinner than the second imprint layer 26, applying the hardening resin material onto the first imprint layer 25 and the spacer layer 33 in the second imprint layer forming step allows the ultraviolet-curable resin material, which has fluidity, to be spread without forming a difference in level at the boundary between a portion of the ultraviolet-curable resin material that overlaps the spacer layer 33 and a portion of the ultraviolet-curable resin material that does not overlap the spacer layer 33. This prevents formation of a difference in level on a surface of the second imprint layer 26.

Further, in the spacer layer forming step, an end 33A of the spacer layer 33 is projected laterally from an outer end of the first imprint layer 25. This allows a worker to, in the spacer layer delaminating step, easily hold the end 33A of the spacer layer 33 that projects laterally from the outer end of the first imprint layer 25, thus improving the workability with which to delaminate the spacer layer 33.

Further, in the second imprint layer forming step, the second imprint layer 26 is made of a photo-curable resin material, in the second groove portion forming step, the second imprint layer 26 in which the second wire forming groove portion 29 has been formed is irradiated with light for curing, and in the spacer layer forming step, the spacer layer 33 is made of a translucent material. In this way, when the second imprint layer 26 in which the second wire forming groove portion 29 has been formed is irradiated with light for curing in the second groove portion forming step, the light passes through the spacer layer 33 made of the translucent material, whereby the second imprint layer 26 can be evenly cured.

Embodiment 2

Embodiment 2 of the present invention is described with reference to FIGS. 18 to 21. Embodiment 2 illustrates changes made to the spacer layer forming step and the spacer layer delaminating step. It should be noted that a repeated description of structures, workings, and effects which are similar to those of Embodiment 1 described above is omitted.

Figure 18:
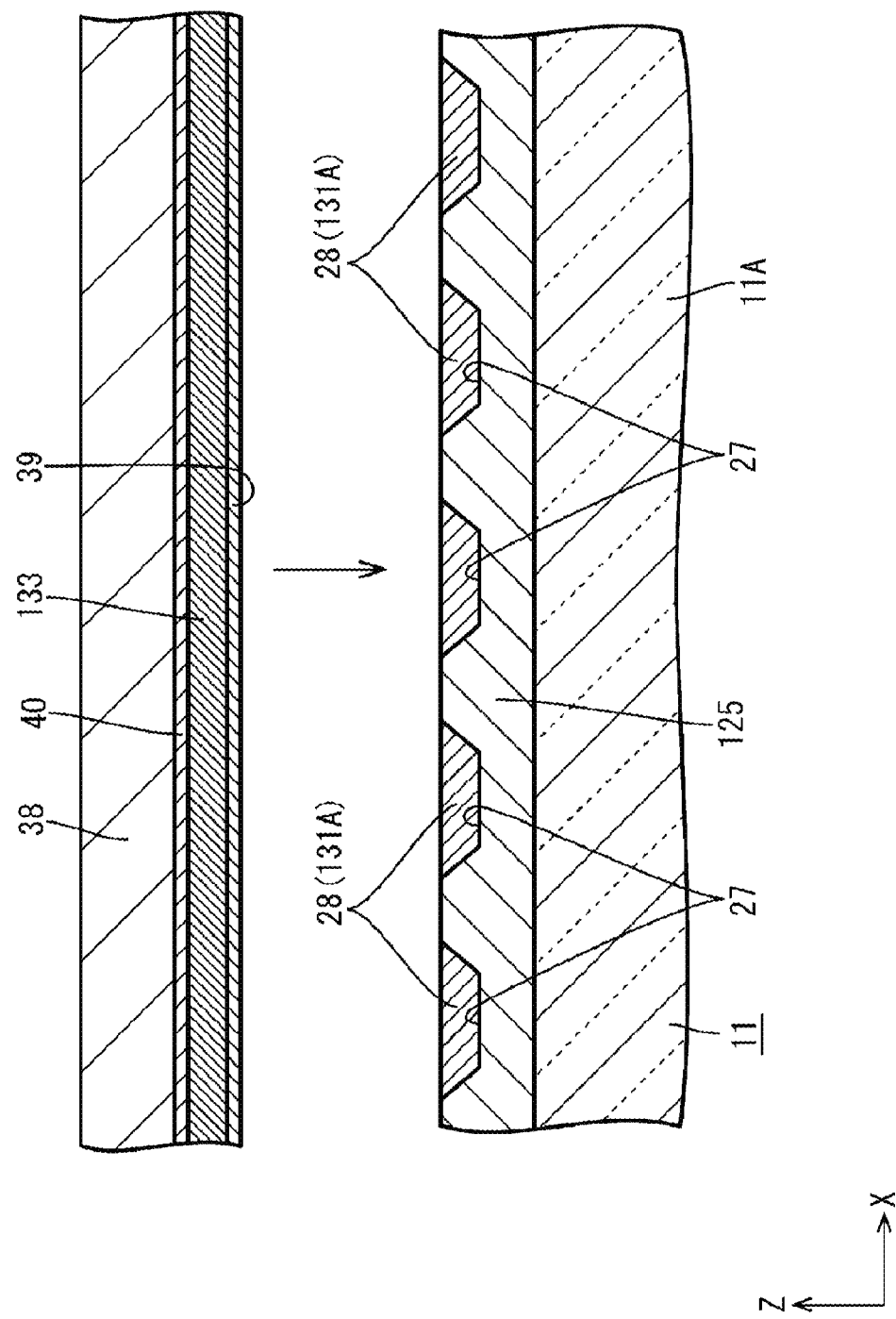
FIG. 18 is a cross-sectional view showing a state where a spacer layer attached to a spacer layer attaching member is to be placed on a first imprint layer in a spacer layer forming step of a method for manufacturing a touch panel according to Embodiment 2 of the present invention.
Figure 19:
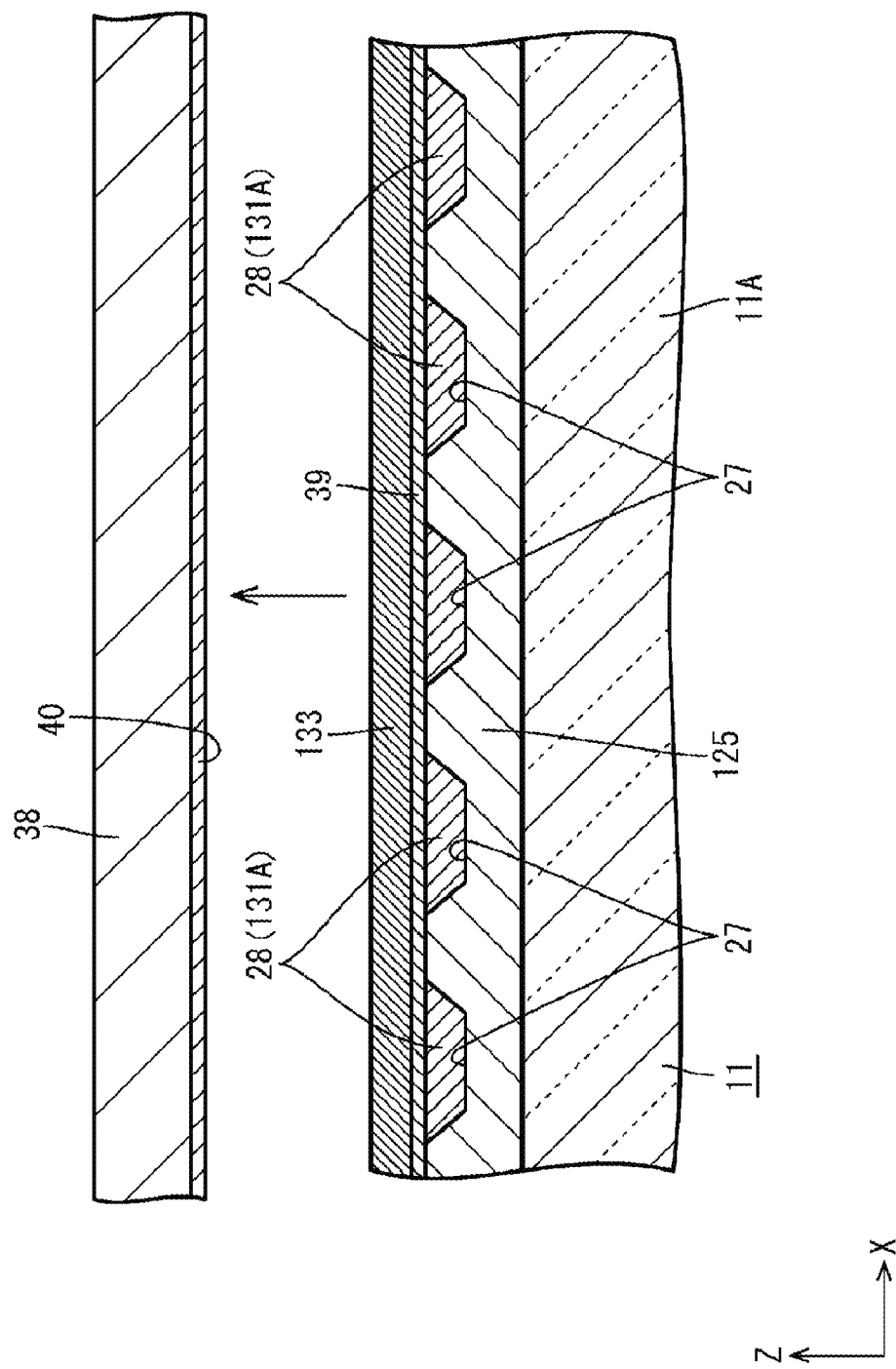
FIG. 19 is a cross-sectional view showing a state where the spacer layer attached to the spacer layer attaching member has been placed on the first imprint layer in the spacer layer forming step.

In the spacer layer forming step according to the present embodiment, as shown in FIG. 18, a spacer layer 133 is placed on a first imprint layer 125 by using a spacer layer attaching member (spacer layer supporting member) 38. The spacer layer attaching member 38 is thicker than the spacer layer 133, and is made of a film that is more rigid than that of which the spacer layer 133 is made. Accordingly, the support of the spacer layer 133 by the spacer layer attaching member 38 makes it hard for the spacer layer 133 to be inadvertently deformed in placing the spacer layer 133 onto the first imprint layer 125, thus making it easy to perform a task of placing the spacer layer 133. Provided on a surface of the spacer layer 133 that faces the first imprint layer 125 is a retaining adhesive layer (strong adhesive layer, weak adhesive layer) 39 for keeping the spacer layer 133 attached to the first imprint layer 125. On the other hand, provided on a surface of the spacer layer attaching member 38 that faces the spacer layer 133 is a temporal tacking adhesive layer (weak adhesive layer) 40 that is relatively weaker in adhesive force than the retaining adhesive layer 39. In the specific placement of the spacer layer 133, the spacer layer 133, which has been attached to the spacer layer attaching member 38 by the temporal tacking adhesive layer 40, is pasted so that the retaining adhesive layer 39 makes contact with the first imprint layer 125. Then, the spacer layer 133 is firmly fixed to the first imprint layer 125 by the retaining adhesive layer 39 with a relatively stronger adhesive force than the temporal tacking adhesive layer 40. After that, the spacer layer attaching member 38 is peeled off, and then, as shown in FIG. 19, the spacer layer 133, which has been firmly fixed to the first imprint layer 125 by the retaining adhesive layer 39, is kept pasted, but the spacer layer attaching member 38, which has been firmly fixed to the spacer layer 133 by the temporal tacking adhesive layer 40 with a relatively weaker adhesive force than the retaining adhesive layer 39, is delaminated from the spacer layer 133. This makes it possible to easily delaminate the spacer layer attaching member 38 from the spacer layer 133 while easily placing the spacer layer 133 onto the first imprint layer 125, thus achieving excellent workability. It should be noted that FIGS. 17 to 20, with reference to which the present embodiment is described, are cross-sectional views of the first imprint layer 125, the spacer layer 133, and the like as taken along the X-axis direction (i.e. a direction of arrangement of first terminal areas 131A) in a place of formation of the first terminal areas 131A.

Figure 20:
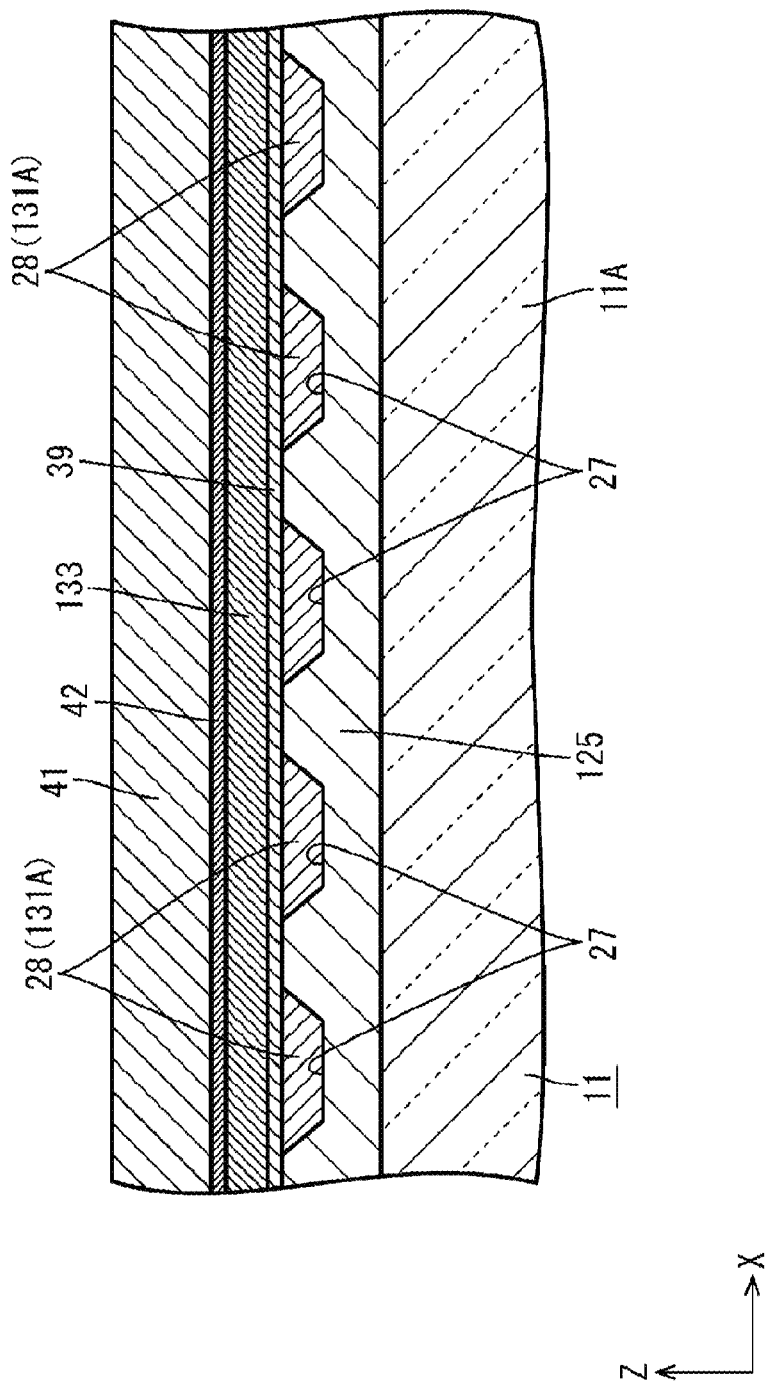
FIG. 20 is a cross-sectional view showing a state where a delaminating member has been attached to the spacer layer in the spacer layer forming step.
Figure 21:
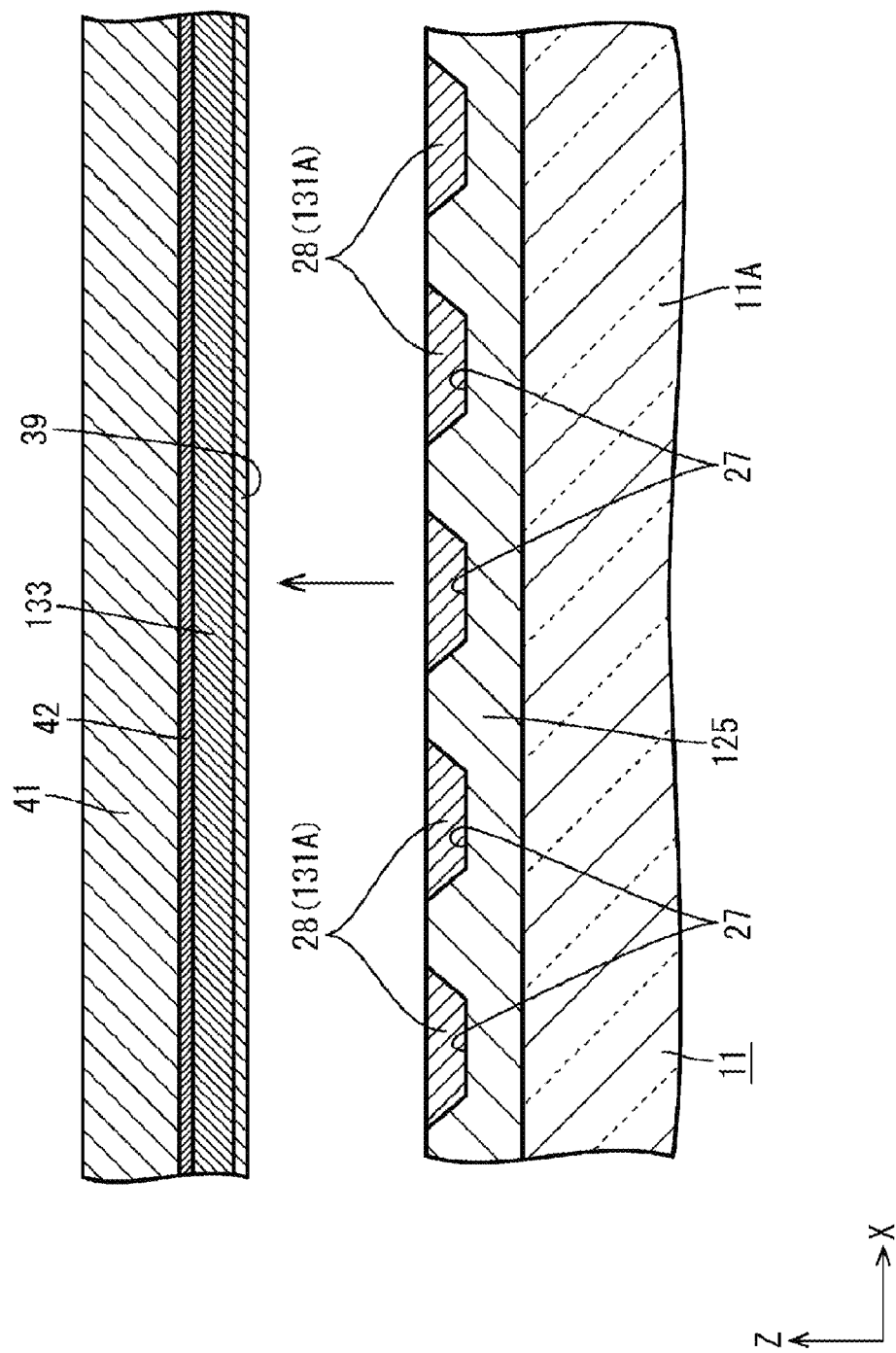
FIG. 21 is a cross-sectional view showing a state where the delaminating member has been delaminated together with the spacer layer in the spacer layer forming step.

In the spacer layer forming step, as shown in FIG. 20, the spacer layer 133 is delaminated from the first imprint layer 125 by using a delaminating member 41. As is the case with the spacer layer attaching member 38, the delaminating member 41 is thicker than the spacer layer 133, and is made of a film that is more rigid than that of which the spacer layer 133 is made. Provided on a surface of the delaminating member 41 that faces the spacer layer 133 is a delaminating adhesive layer (strong adhesive layer) 42 that is relatively stronger in adhesive force than the retaining adhesive layer 39. Specifically, in delaminating the spacer layer 133, the delaminating member 41 is pasted to the spacer layer 133, which has been firmly fixed to the first imprint layer 125 by the retaining adhesive layer 39, so that the delaminating adhesive layer 42 makes contact with the outer surface of the spacer layer 133. Then, the delaminating member 41 is firmly fixed to the spacer layer 133 by the delaminating adhesive layer 42 with a relatively stronger adhesive force than the retaining adhesive layer 39. After that, the delaminating member 41 is peeled off, and then, as shown in FIG. 21, the spacer layer 133, which has been firmly fixed to the first imprint layer 125 by the retaining adhesive layer 39 with a relatively weaker adhesive force than the delaminating adhesive layer 42, is delaminated from the first imprint layer 125. This makes it possible to easily delaminate the spacer layer 133 from the first imprint layer 125, thus achieving excellent workability.

As described above, according to the present embodiment, in the spacer layer forming step, the spacer layer 133 whose surface facing the first imprint layer 125 is provided with a retaining adhesive layer 39, which is a strong adhesive layer having a relatively strong adhesive force, is attached via a temporal tacking adhesive layer 40, which is a weak adhesive layer having a relatively weak adhesive force, to a spacer layer attaching member 38 placed on a side of the spacer layer 133 opposite to the first imprint layer 125, and after the spacer layer 133 has been pasted so that the retaining adhesive layer 39, which is a strong adhesive layer, makes contact with the first imprint layer 125, the spacer layer attaching member 38 is delaminated from the spacer layer 133. In this way, the spacer layer 133 is pasted to the first imprint layer 125 by the retaining adhesive layer 39, which is a strong adhesive layer, with a relatively strong adhesive force. Since the spacer layer attaching member 38 placed on the side of the spacer layer 133 opposite to the first imprint layer 125 is attached to the spacer layer 133 via the temporal tacking adhesive layer 40, which is a weak adhesive layer having a relatively weak adhesive force, the spacer layer attaching member 38 can be easily delaminated from the spacer layer 133 while the retaining adhesive layer 39, which is a strong adhesive layer, is keeping the spacer layer 133 pasted to the first imprint layer 125.

Further, in the spacer layer forming step, the spacer layer 133 is pasted to the first imprint layer 125 via the retaining adhesive layer 39, which is a weak adhesive layer having a relatively weak adhesive force, and in the spacer layer delaminating step, after a delaminating member 41 has been pasted to the spacer layer 133 via a delaminating adhesive layer 42, which is a strong adhesive layer having a relatively strong adhesive force, from the side of the spacer layer 133 opposite to the first imprint layer 125, the delaminating member 41 is delaminated from the first imprint layer 125 together with the spacer layer 133. In this way, in the spacer layer forming step, the spacer layer 133 is pasted to the first imprint layer 125 via the retaining adhesive layer 39, which is a weak adhesive layer having a relatively weak adhesive force. In the spacer layer delaminating step, the delaminating member 41 is pasted to the spacer layer 133 via the delaminating adhesive layer 42, which is a strong adhesive layer having a relatively strong adhesive force, from the side of the spacer layer 133 opposite to the first imprint layer 125. After that, when the delaminating member 41 is peeled off from the first imprint layer 125, the spacer layer 133, which has been pasted to the delaminating member 41 via the delaminating adhesive layer 42, which is a strong adhesive layer, is delaminated from the first imprint layer 125 together with the delaminating member 41. In this way, the spacer layer 133 can be easily delaminated from the first imprint layer 125.

Embodiment 3

Embodiment 3 of the present invention is described with reference to FIG. 22 or 23. Embodiment 3 illustrates the addition of a conductive paste material 44 to the configuration described in Embodiment 1 described above. It should be noted that a repeated description of structures, workings, and effects which are similar to those of Embodiment 1 described above is omitted.

Figure 22:
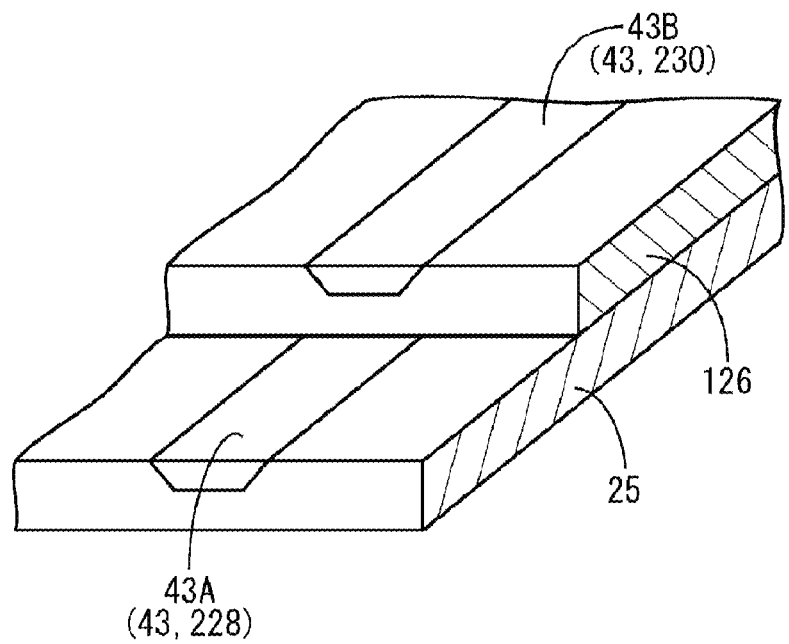
FIG. 22 is a partially-notched perspective view showing a ground wire according to Embodiment 3 of the present invention.
Figure 23:
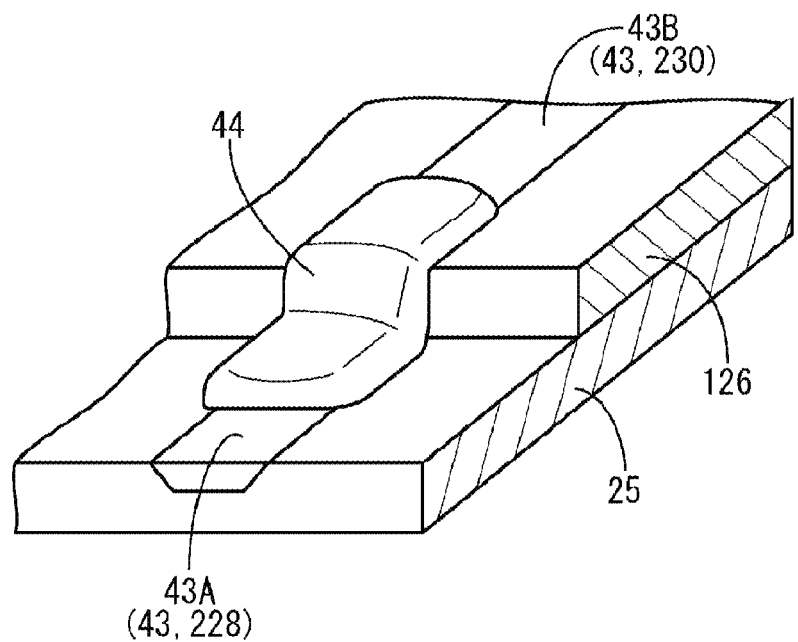
FIG. 23 is a partially-notched perspective view showing a state where a conductive paste material has been applied in such a manner as to lie astride first and second ground wires constituting the ground wire.

As shown in FIG. 22, parts of first and second wires 228 and 230 according to the present embodiment constitute a ground wire 43. The ground wire 43 serves to transmit a ground signal that is supplied from a touch panel flexible substrate (not illustrated), and has a function of, for example, shielding an electric field that may be generated between first and second touch electrodes (not illustrated). The ground wire 43 is constituted by a first ground wire 43A composed of the first wire 228 and a second ground wire 43B composed of the second wire 230, and a difference in level corresponding to the thickness of the second imprint layer 126 is formed between the first ground wire 43A and the second ground wire 43B. Accordingly, in the present embodiment, as shown in FIG. 23, a conductive paste material 44 is provided in such a manner as to lie astride the first ground wire 43A and the second ground wire 43B. The conductive paste material 44 is composed of a paste material containing an electrical conducting material such as silver. By being applied in such a manner as to get over the difference in level formed between the first ground wire 43A and the second ground wire 43B, the conductive paste material 44 electrically connects the first ground wire 43A to the second ground wire 43B, thereby making it possible to bring the ground wire 43 into conduction.

Embodiment 4

Embodiment 4 of the present invention is described with reference to FIGS. 24 to 35. Embodiment 4 illustrates changes made from Embodiment 1 described above to configure a spacer layer 45. It should be noted that a repeated description of structures, workings, and effects which are similar to those of Embodiment 1 described above is omitted.

Figure 24:
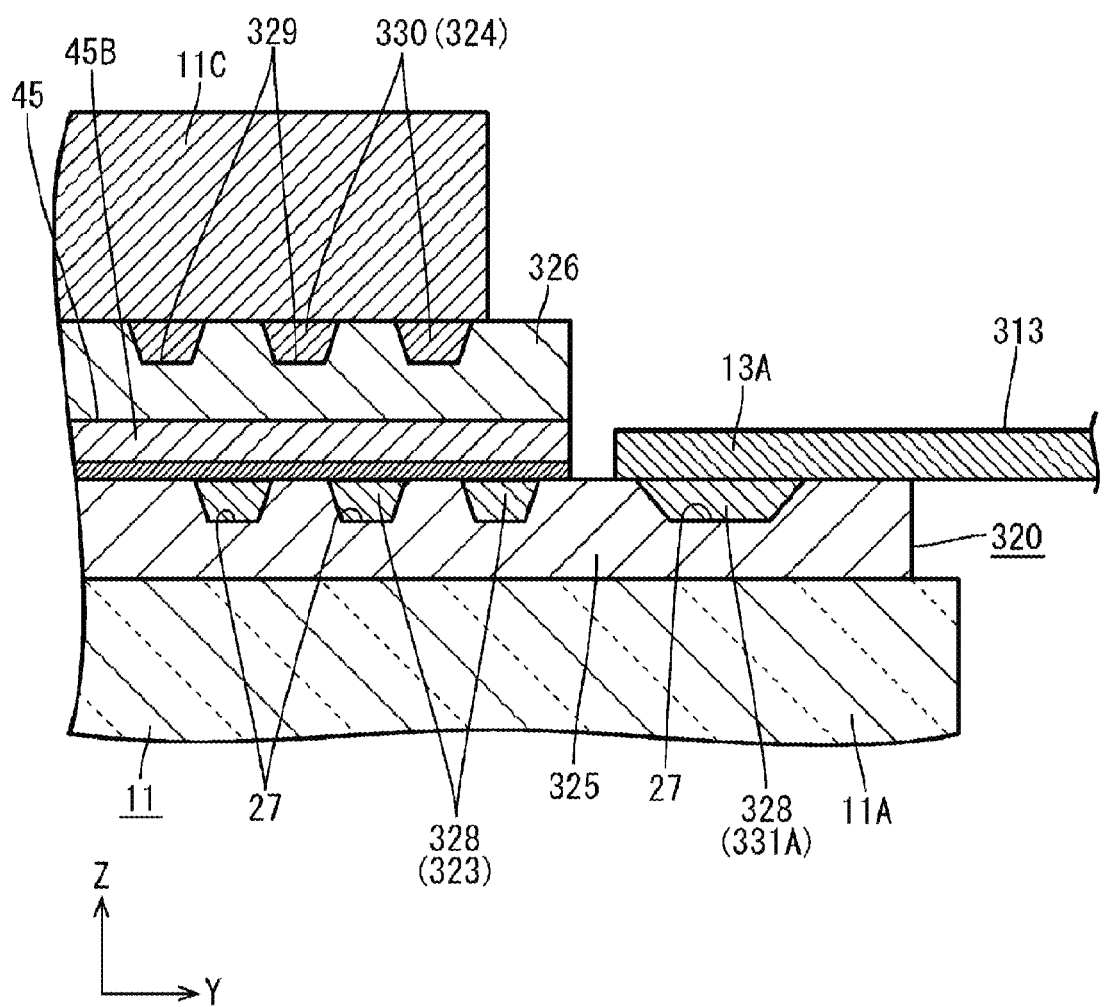
FIG. 24 is a cross-sectional view of a CF substrate and a touch panel according to Embodiment 4 of the present invention.

As shown in FIG. 24, a touch panel 320 according to the present embodiment includes a spacer layer 45. The spacer layer 45 is placed in such a manner as to be sandwiched between a first imprint layer 325 and a second imprint layer 326, and has a range of formation that overlaps the entirety of the second imprint layer 326. Accordingly, the range of formation of the spacer layer 45 also overlaps the entirety of second wires 330 formed in the second imprint layer 326 (see FIG. 30). In this way, by the range of formation of the spacer layer 45 overlapping the entirety of first wires 328, the distance between the first wires 328 formed in the first imprint layer 325 and the second wires 330 formed in the second imprint layer 326 can be increased. This is suitable to reducing a parasitic capacitance that may be formed between the first wires 328 and the second wires 330. Further, the spacer layer 45 may be made of a material such as TAC (triacetyl cellulose), COP (cycloolefin polymer), or PI (polyimide), each of which is a material that has translucency but does not have an optical phase difference.

Figure 25:
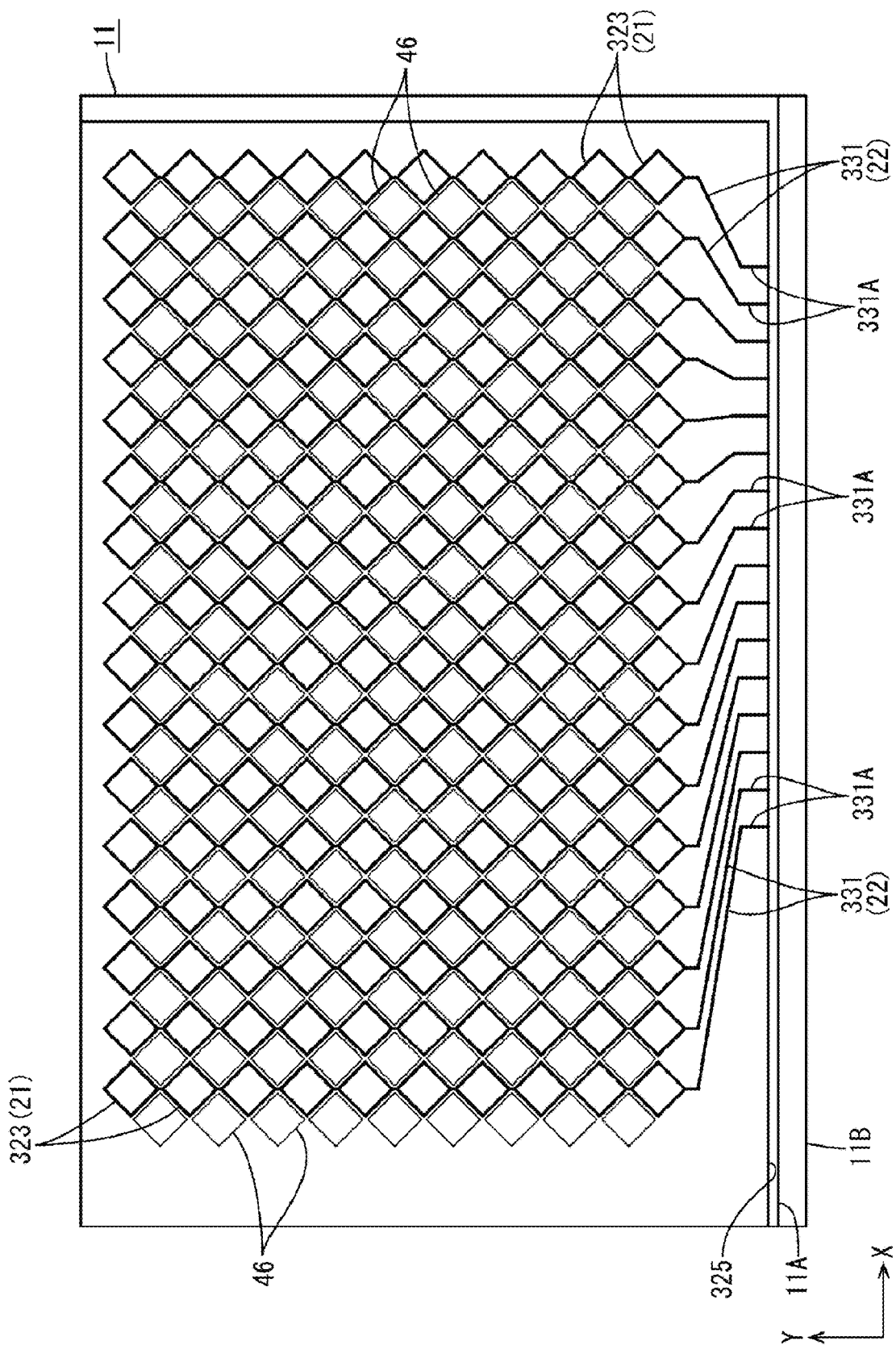
FIG. 25 is a plan view showing a first imprint layer with first wires formed therein in a first wire forming step of a method for manufacturing a touch panel.

Furthermore, in the touch panel 320, as shown in FIG. 25, some of the first wires 328 constitute first dummy electrodes 46 placed adjacent to first touch electrodes 323 but separated from the first touch electrodes 323 not to overlap the first touch electrodes 323. It should be noted that FIG. 25 uses relatively thin solid lines to illustrate the first dummy electrodes 46. The first dummy electrodes 46 are substantially rhomboidal in planar shape as is the case with the first touch electrodes 323, but are planarly arranged complementarily to the first touch electrodes 323. That is, pluralities of the first dummy electrodes 46 are placed side by side along the X-axis direction and the Y-axis direction in such a manner as to complement an area where no first touch electrodes 323 are formed. Each of the first dummy electrodes 46 is not connected to a first touch electrode 323 adjacent thereto, is also not connected to a first dummy electrode 46 adjacent thereto, and is electrically isolated from the other first dummy electrode 46. The first dummy electrodes 46 are provided so as to be disposed to overlap the after-mentioned second touch electrodes 324 in plan view.

Figure 35:
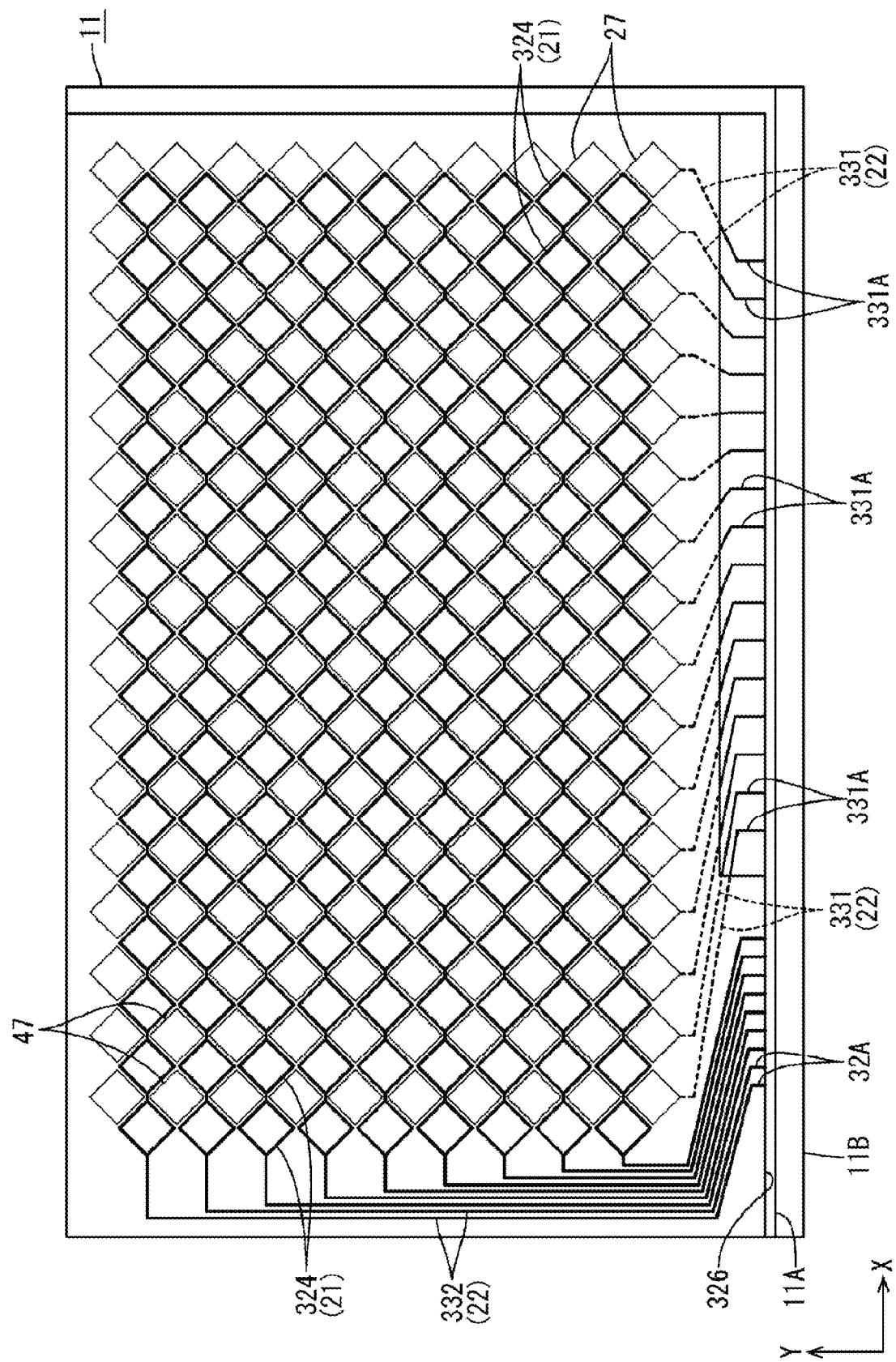
FIG. 35 is a plan view showing a state where the first portion of the spacer layer has been removed together with a portion of the second imprint layer in the spacer layer delaminating step.

As is the case with the first wires 328, as shown in FIG. 35, some of the second wires 330 constitute second dummy electrodes 47 placed adjacent to second touch electrodes 324 but separated from the second touch electrodes 324 not to overlap the second touch electrodes 324. It should be noted that FIG. 35 uses relatively thin solid lines to illustrate the second dummy electrodes 47. The second dummy electrodes 47 are substantially rhomboidal in planar shape as is the case with the second touch electrodes 324, but are planarly arranged complementarily to the second touch electrodes 324. That is, pluralities of the second dummy electrodes 47 are placed side by side along the X-axis direction and the Y-axis direction in such a manner as to complement an area where no second touch electrodes 324 are formed. Each of the second dummy electrodes 47 is not connected to a second touch electrode 324 adjacent thereto, is also not connected to a second dummy electrode 47 adjacent thereto, and is electrically isolated from the other second dummy electrode 47. The second dummy electrodes 47 are provided so as to be disposed to overlap the aforementioned first touch electrodes 323 in plan view.

Figure 26:
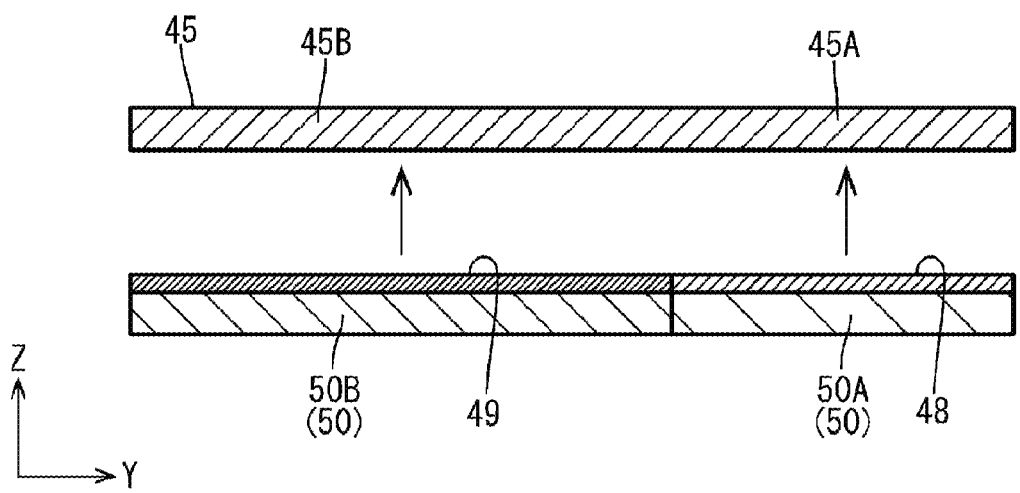
FIG. 26 is a cross-sectional view showing a state where an adhesive layer transferring member is to be pasted to a spacer layer in a spacer layer forming step of the method for manufacturing a touch panel.
Figure 27:
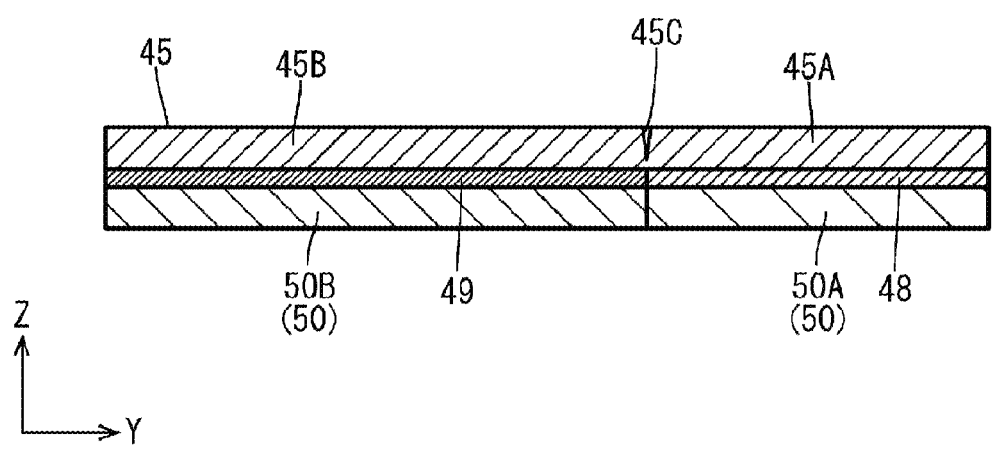
FIG. 27 is a cross-sectional view showing a state where the adhesive layer transferring member has been pasted to the spacer layer in the spacer layer forming step.

Next, steps of a method for manufacturing a touch panel 320 which are different from those of Embodiment 1 described above are intensively described. In the first wire forming step, first wires 328 are formed in a first imprint layer 325. Then, as shown in FIG. 25, first touch electrodes 323, first peripheral wires 331, and first dummy electrodes 46 that are constituted by the first wires 328 are provided. In the spacer layer forming step, first, a spacer layer 45 that is equal in size to a second imprint layer 326 is prepared, and two types of adhesive layer 48 and 49 differing in adhesive force from each other are provided on a surface of a spacer layer 45 that faces the second imprint layer 326. The two types of adhesive layer 48 and 49 include a weak adhesive layer 48 having a relatively weak adhesive force and a strong adhesive layer 49 having a relatively strong adhesive force. The adhesive layers 48 and 49 are transferred to the spacer layer 45 by using an adhesive layer transferring member 50 shown in FIG. 26. As shown in FIG. 26, the adhesive layer transferring member 50 is substantially the same in total size as the spacer layer 45, and is constituted by a weak adhesive layer transferring portion 50A to which the weak adhesive layer 48 has been applied and a strong adhesive layer transferring portion 50B to which the strong adhesive layer 49 has been applied, and these portions are physically separated from each other. The weak adhesive layer transferring portion 50A of the adhesive layer transferring member 50 is placed so as to overlap a portion (first portion 45A) of the spacer layer 45 that overlaps first terminal areas 331A of the first wires 328. Meanwhile, the strong adhesive layer transferring portion 50B is placed so as to overlap a portion (second portion 45B) of the spacer layer 45 other than the first portion 45A or, specifically, a portion of the spacer layer 45 that overlaps a majority of first touch electrodes 323 and first peripheral wires 331 of the first wires 328 excluding the first terminal areas 331A. Moreover, the adhesive layer transferring member 50 is pasted to the spacer layer 45. Then, as shown in FIG. 27, the weak adhesive layer 48 of the weak adhesive layer transferring portion 50A and the strong adhesive layer 49 of the strong adhesive layer transferring portion 50B are transferred to the first portion 45A and the second portion 45B, respectively. After that, the adhesive layer transferring member 50 is delaminated from the spacer layer 45. Further, in the spacer layer forming step, a separation facilitating portion 45C is formed between the first and second portions 45A and 45B of the spacer layer 45 to facilitate separation of the first and second portions 45A and 45B from each other. The separation facilitating portion 45C is composed of a cut (half cut), formed for example by irradiating the spacer layer 45 with laser light from a side opposite to the adhesive layers 48 and 49, that is shallower than the thickness of the spacer layer 45.

Figure 28:
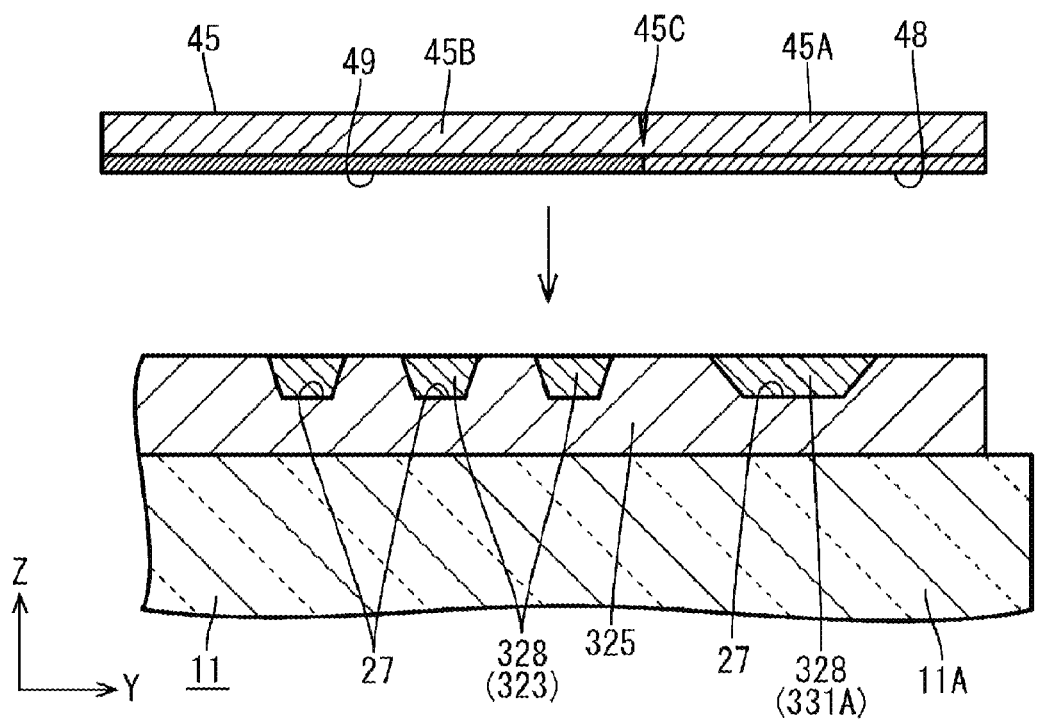
FIG. 28 is a cross-sectional view showing a state where the spacer layer to which an adhesive layer has been transferred is to be pasted to the first imprint layer in the spacer layer forming step.
Figure 29:
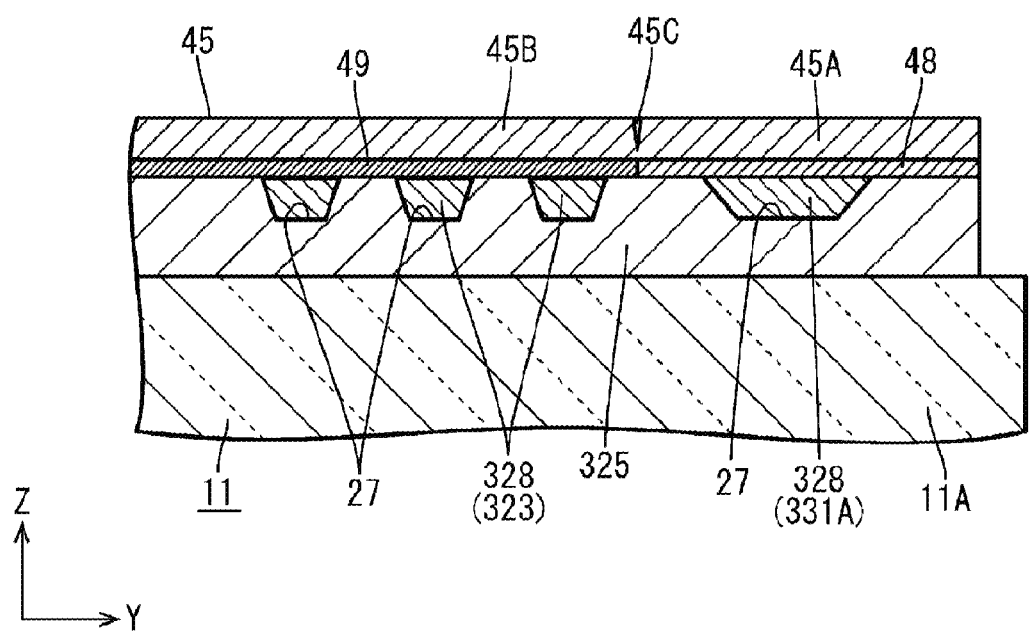
FIG. 29 is a cross-sectional view showing a state where the spacer layer to which the adhesive layer has been transferred has been pasted to the first imprint layer in the spacer layer forming step.
Figure 30:
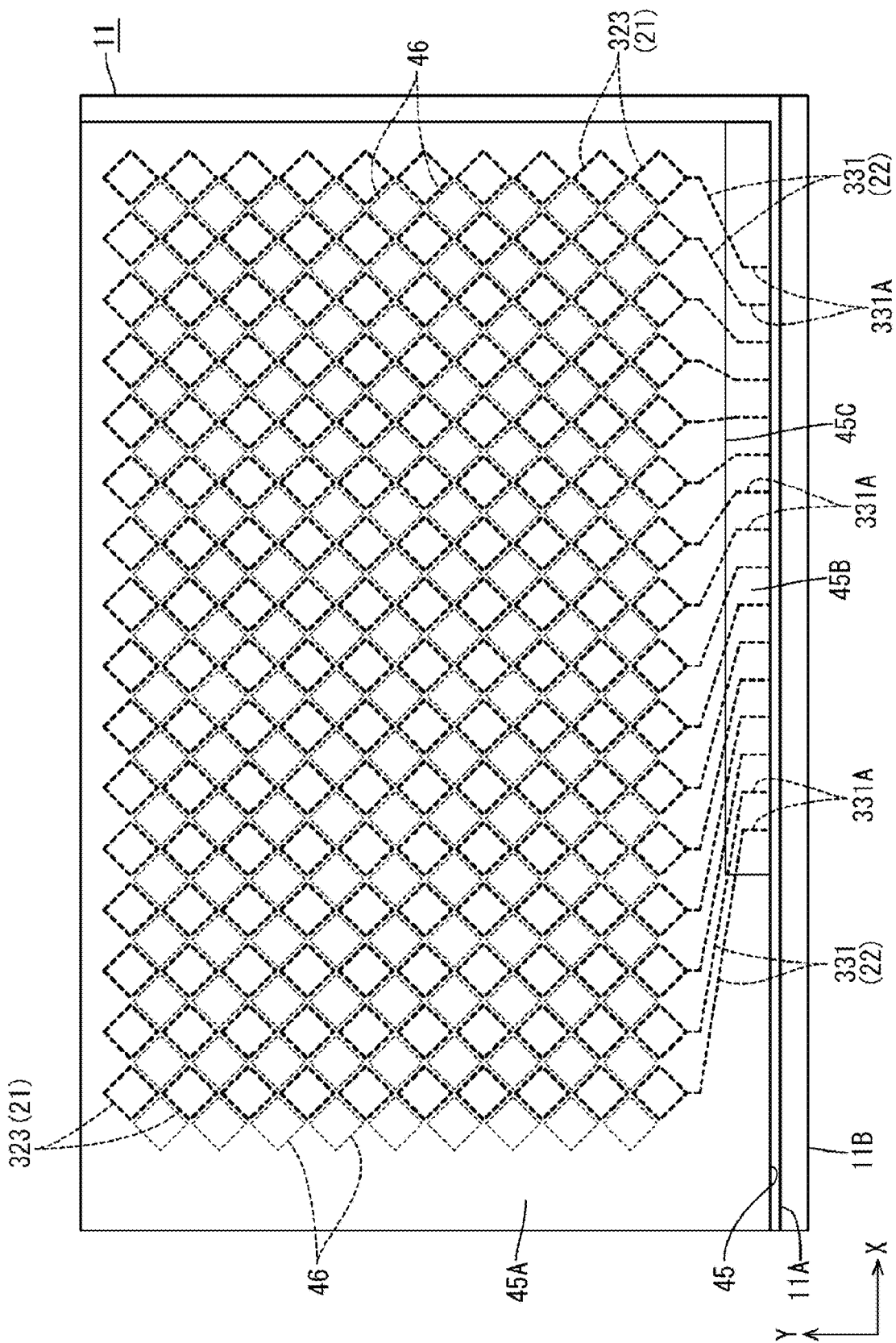
FIG. 30 is a plan view showing the first imprint layer with the spacer layer pasted thereto in the first spacer layer forming step.

Next, in the spacer layer forming step, a task of attaching the spacer layer 45, to which the two types of adhesive layer 48 and 49 have been transferred, to the first imprint layer 325 is performed. As shown in FIG. 28, the spacer layer 45 is pasted so that the adhesive layers 48 and 49 make contact with the first imprint layer 325. Then, the first portion 45A of the spacer layer 45 is firmly fixed to the first imprint layer 325 by the weak adhesive layer 48 with a relatively weaker adhesive force than the strong adhesive layer 49, and on the other hand, the second portion 45B of the spacer layer 45 is firmly fixed to the first imprint layer 325 by the strong adhesive layer 49 with a relatively stronger adhesive force than the weak adhesive layer 48. This keeps the spacer layer 45 attached to the first imprint layer 325 via the weak adhesive layer 48 and the strong adhesive layer 49. At this point in time, the first portion 45A of the spacer layer 45 is disposed to overlap the first terminal areas 331A. As shown in FIG. 30, the spacer layer 45, which has been attached to the first imprint layer 325, is formed to have a range of formation that overlaps the entirety of at least the first wires 328 and have a range of formation that overlaps the entirety of the first imprint layer 325. In this way, a task of aligning the spacer layer 45 with the first imprint layer 325 in the spacer layer forming step is more easily performed than in a case where, as in Embodiment 1 described above, the spacer layer 33 has a range of formation that partially overlaps the first imprint layer 25.

Figure 31:
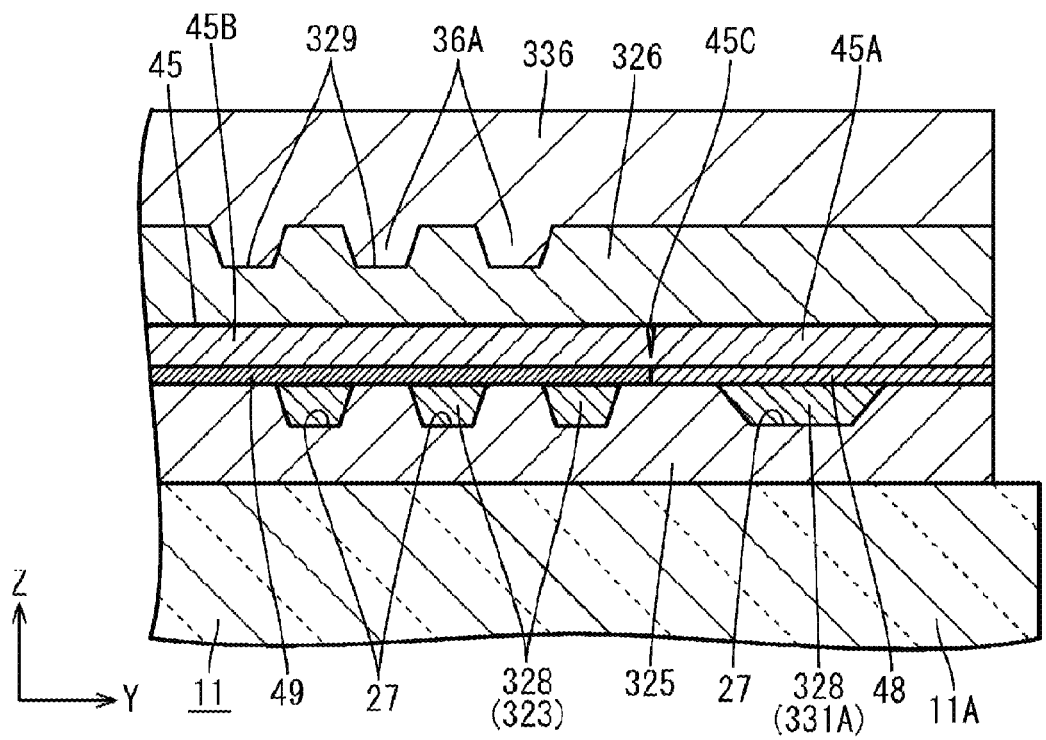
FIG. 31 is a cross-sectional view showing a state where a second imprint block has been pressed against a second imprint layer uncured in a second groove portion forming step of the method for manufacturing a touch panel.
Figure 32:
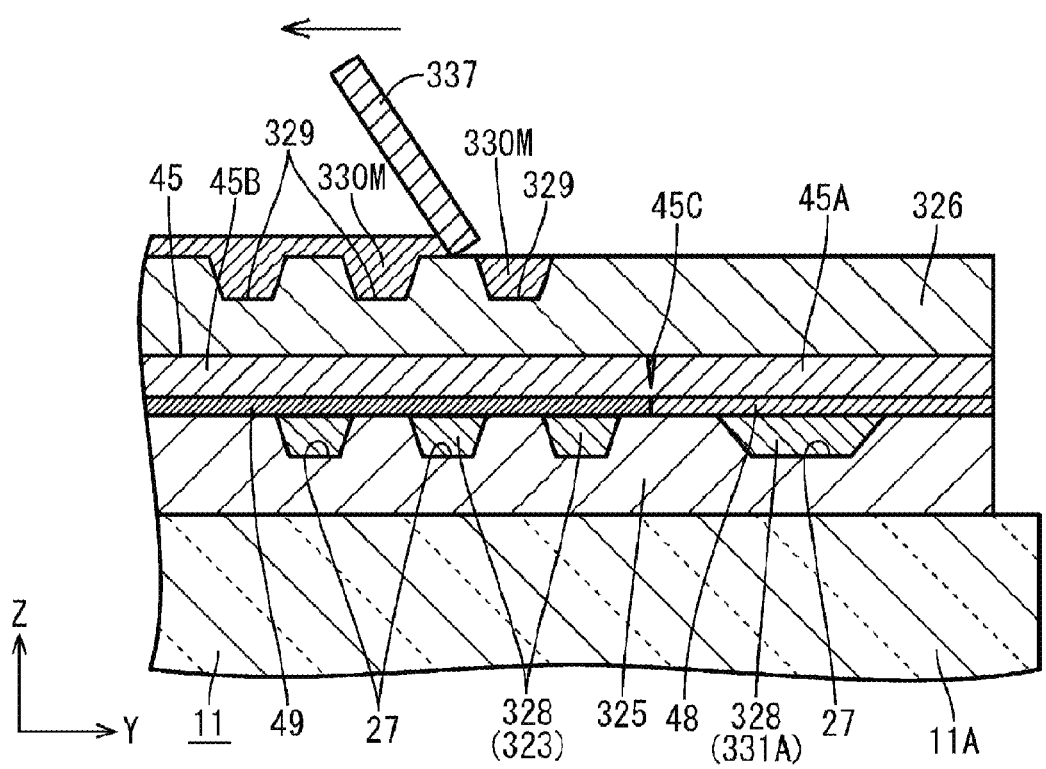
FIG. 32 is a cross-sectional view showing a task of filling second wire forming groove portions with a material of second wires with a squeegee in a second wire forming step of the method for manufacturing a touch panel.
Figure 33:
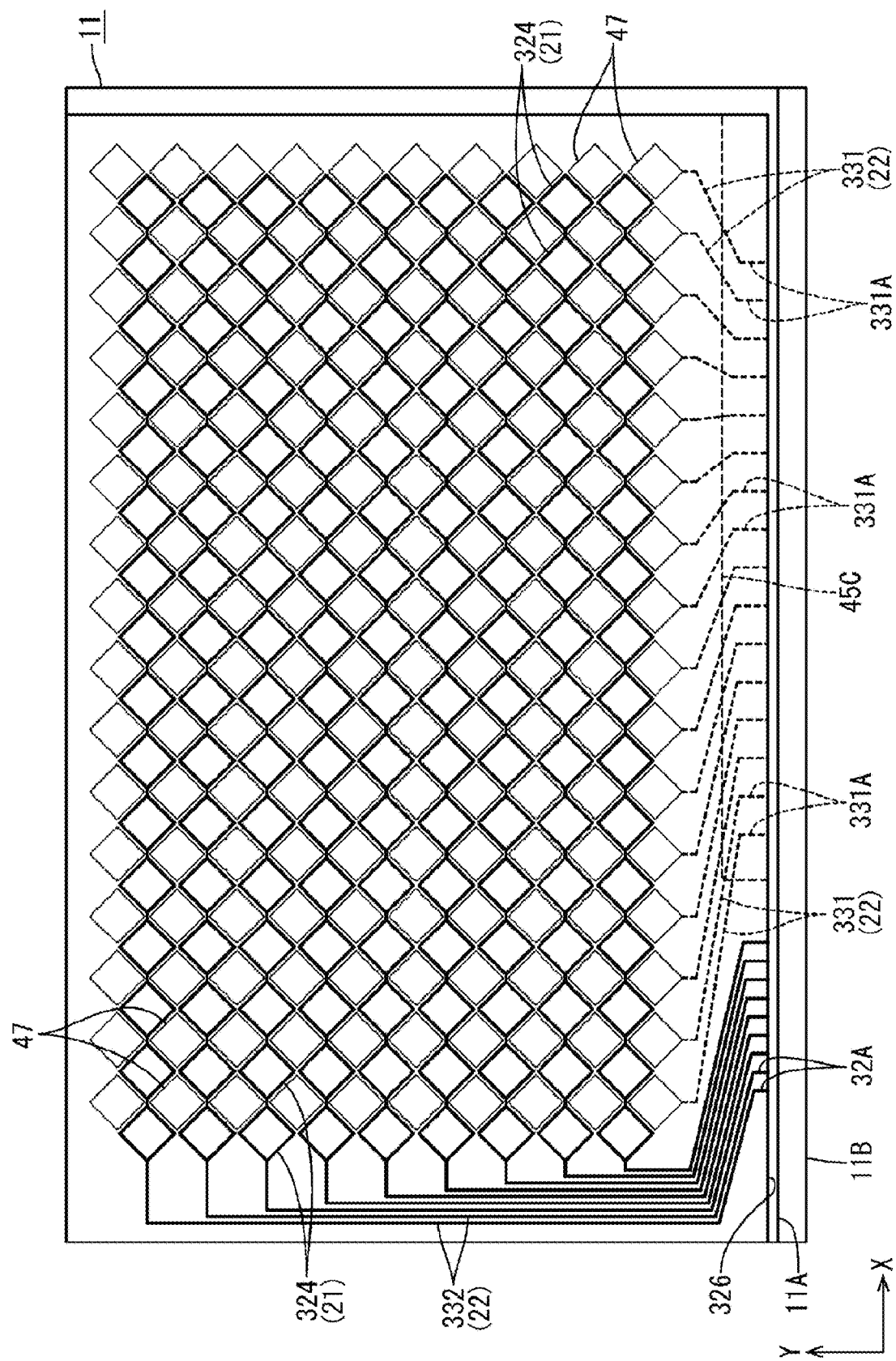
FIG. 33 is a plan view showing the first imprint layer with second wires formed therein in the second wire forming step.

After that, in the second imprint layer forming step, a second imprint layer 326 made of an ultraviolet-curable resin material is formed on the front surface of the spacer layer 45 (see FIG. 31). Since the spacer layer 45 has a range of formation that overlaps the entirety of the first imprint layer 325, the second imprint layer 326, which is stacked on the surface of the spacer layer 45, hardly has unevenness in thickness across the second imprint layer 326. In the second groove portion forming step that follows, as shown in FIG. 31, a second imprint block 336 is pressed against a surface of the second imprint layer 326 uncured, as in the case of Embodiment 1 described above. Once the second imprint layer 326 is sufficiently cured by being irradiated with ultraviolet rays, the second imprint layer 326 is delaminated, whereby second wire forming groove portions 329 are formed. After that, in the second wire forming step, as shown in FIG. 32, a material 330M of second wires 330 is dried after having been applied by a squeegee 337 onto the surface of the second imprint layer 326 in which the second wire forming groove portions 329 have been formed, as in the case of Embodiment 1 described above. Thus, as shown in FIG. 33, the second wires 330 are formed. The second imprint layer 326 is provided with second touch electrode 324, second peripheral wires 332, and second dummy electrodes 47 that are constituted by the second wires 330. Note here that in forming the second touch electrodes 324, which are constituted by the second wires 330, in the second wire forming step, the second touch electrodes 324 might be misaligned with the first touch electrodes 323. In that regard, since the first and second dummy electrodes 46 and 47 placed adjacent to the first and second touch electrodes 323 and 324, respectively, but separated from the first and second touch electrodes 323 and 324 are formed in the first and second wire forming steps, respectively, such misalignment of the second touch electrodes 324 with the first touch electrodes 323, if any, is rendered hardly visually recognizable by the first and second dummy electrodes 46 and 47, which are placed in such a manner as to complement the first and second touch electrodes 323 and 324.

Figure 34:
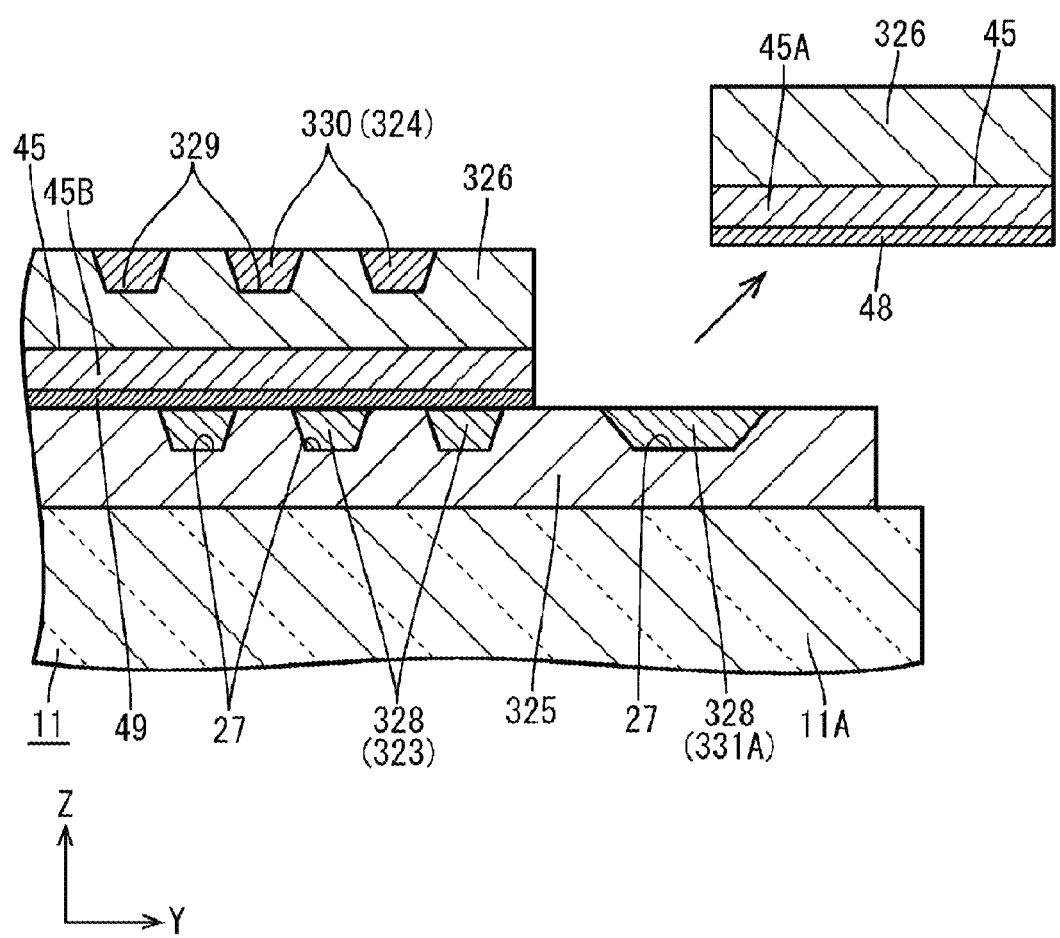
FIG. 34 is a cross-sectional view showing a state where a first portion of the spacer layer has been removed together with a portion of the second imprint layer in a spacer layer delaminating step of the method for manufacturing a touch panel.

In the spacer layer delaminating step, as shown in FIG. 34, the first portion 45A of the spacer layer 45 is delaminated from the first imprint layer 325 while being separated from the second portion 45B. Note here that since the first portion 45A of the spacer layer 45, which has been firmly fixed to the first imprint layer 325 by the weak adhesive layer 48 with a relatively weak adhesive force, is more easily delaminated than the second portion 45B, which has been firmly fixed by the strong adhesive layer 49 with a relatively strong adhesive force. Meanwhile, the second portion 45B, which has been firmly fixed to the first imprint layer 325 by the strong adhesive layer 49, is hardly delaminated following the delamination of the first portion 45A. This makes it easy to selectively delaminate the first portion 45A. Moreover, since the separation facilitating portion 45C has been formed at a boundary position in the spacer layer 45 between the first portion 45A and the second portion 45B, separation of the first portion 45A is facilitated in separating the first portion 45A from the second portion 45B. This brings about improvement in workability and also brings about improvement in yield. Such removal of the first portion 45A of the spacer layer 45 together with a portion of the second imprint layer 326 (i.e. a portion of the second imprint layer 326 that overlaps the first portion 45A) renders the first terminal areas 331A of the first peripheral wires 331 exposed to the outside as shown in FIG. 35, thus making it possible to mount a touch panel flexible substrate 313 (see FIG. 24) on the exposed portion for connection.

As described above, according to the present embodiment, in the spacer layer forming step, the spacer layer 45 is formed to have a range of formation that overlaps an entirety of at least the first wire 328, and in the spacer delaminating step, a first portion 45A of the spacer layer 45 that overlaps a part of the first wire 328 is delaminated from the first imprint layer 325 while being separated from a second portion 45B of the spacer layer 45 other than the first portion 45A. In this way, by the range of formation of the spacer layer 45 overlapping the entirety of the first wire 328, the distance between the first wire 328 formed in the first imprint layer 325 and the second wire 330 formed in the second imprint layer 326 can be increased. This is suitable to reducing a parasitic capacitance that may be formed between the first wire 328 and the second wire 330.

Further, in the spacer layer forming step, a separation facilitating portion 45C is formed between the first and second portions 45A and 45B of the spacer layer 45 to facilitate separation of the first and second portions 45A and 45B from each other. In this way, the separation facilitating portion 45C facilitates separation of the first portion 45A from the second portion 45B in the spacer layer delaminating step. This brings about improvement in workability and also brings about improvement in yield.

Further, in the spacer layer forming step, the spacer layer 45 is pasted to the first imprint layer 325 while a weak adhesive layer 48 having a relatively weak adhesive force is sandwiched between the first portion 45A of the spacer layer 45 and the first imprint layer 325 and a strong adhesive layer 49 having a relatively strong adhesive force is sandwiched between the second portion 45B and the first imprint layer 325. In this way, in delaminating the first portion 45A from the first imprint layer 25 while separating the first portion 45A from the second portion 45B in the spacer layer delaminating step, the strong adhesive layer 49 makes it hard for the section portion 45B to delaminate following the first portion 45A and the weak adhesive layer 48 makes it easy to selectively delaminate the first portion 45A.

Further, in the spacer layer forming step, the spacer layer 45 is formed to have a range of formation that overlaps an entirety of the first imprint layer 325. In this way, a task of aligning the spacer layer 45 with the first imprint layer 325 in the spacer layer forming step is more easily performed than if the spacer layer has a range of formation that partially overlaps the first imprint layer 325.

Further, in the first and second wire forming steps, the first and second wires 328 and 330 are formed to constitute first and second touch electrodes (first and second position detecting electrodes) 323 and 324, respectively, that form electrostatic capacitances with a position input body which performs a position input in a plate surface of the touch panel 320, that is capable of detecting a position inputted by the position input body, and that do not overlap each other, and in addition, the first and second wires 328 and 330 are formed to constitute first and second dummy electrodes 46 and 47, respectively, placed adjacent to the first and second touch electrodes 323 and 324, respectively, but separated from the first and second touch electrodes 323 and 324, that do not overlap each other. In this way, a position input by the position input body can be detected by the first and second touch electrodes 323 and 324, which do not overlap each other. In forming the second touch electrode 324, which is constituted by the second wire 330, in the second wire forming step, the second touch electrode 324 might be misaligned with the first touch electrode 323. In that regard, since the first and second dummy electrodes 46 and 47 placed adjacent to the first and second touch electrodes 323 and 324, respectively, but separated from the first and second touch electrodes 323 and 324 are formed in the first and second wire forming steps, respectively, such misalignment of the second touch electrode 324 with the first touch electrode 323, if any, is rendered hardly visually recognizable by the first and second dummy electrodes 46 and 47, which are placed in such a manner as to complement the first and second touch electrodes 323 and 324.

Other Embodiments

The present invention is not limited to the embodiments described above with reference to the drawings. The following embodiments may be included in the technical scope of the present invention.

(1) Although Embodiment 1 described above has illustrated a case where the spacer layer is approximately half as thick as the second imprint layer, the specific thickness of the spacer layer may be changed as appropriate. Even in that case, it is preferable, but is not necessary, that the spacer layer be thinner than the second imprint layer.

(2) Besides the configuration illustrated in Embodiment 1 described above, the specific range of formation of the spacer layer may be changed as appropriate. The range of formation of the spacer layer may be changed as appropriate in so far as not to overlap the second wire provided in the second imprint layer.

(3) The technology for projecting the end of the spacer layer laterally from the outer end of the first imprint layer described in Embodiment 1 described above may of course be applied to the configurations described in Embodiments 2 to 4.

(4) Although Embodiment 3 described above has illustrated a case where the conductive paste material is used for connection of the ground wire, the conductive paste material may also be used, for example, for connection of a guide link provided in the touch panel for ESD protection.

(5) Besides Embodiment 3 described above, the specific technique for connecting the first ground wire to the second ground wire may be changed as appropriate. For example, it is also possible to employ a technique by which a ground connecting wire that is disposed to overlap the first ground wire and the second ground wire is formed in advance in such a manner as to lie astride the first ground wire and the second ground wire and, at the time of mounting of the touch panel flexible substrate, the aforementioned ground connecting wire is brought into conduction with the first ground wire and the second ground wire via the anisotropic conductive film. This causes the first ground wire and the second ground wire to be electrically connected to each other via the ground connecting wire.

(6) Although Embodiment 4 described above has illustrated a case where the spacer layer has a range of formation that overlaps the entirety of the first imprint layer, the spacer layer may alternatively have a range of formation that partially overlaps the first imprint layer. Even in that case, it is preferable, but is not necessary, that the spacer layer have a range of formation that overlaps the entirety of the first wire.

(7) Although Embodiment 4 described above has illustrated a case where the separation facilitating portion is a half cut that is formed by irradiation with laser light, another example of the separation facilitating portion may be perforations (cuts placed intermittently) made along the boundary line between the first portion and the second portion.

(8) Although Embodiment 4 and (7) described above have illustrated a case where the separation facilitating portion is formed in the spacer layer, it is also possible to separate the first and second portions of the spacer layer from each other in advance without forming the separation facilitating portion. A specific method for manufacturing in this case is described. In the spacer layer forming step, first, first and second portions separated from each other are supported on a separator (support film) in a state of being disposed adjacent to each other. Adhesive layers are formed on surfaces of the first imprint layer that face the first portion and the second portion, respectively. By delaminating the separator after having pasted the first portion and the second portion to the first imprint layer via the separator, the first portion and the second portion are attached to the first imprint layer with proper placement. After that, in the spacer layer delaminating step, the first portion, which has been completely separated from the second portion, can be easily delaminated.

(9) The technology for providing first and second dummy electrodes described in Embodiment 4 described above may of course be applied to the configurations described in Embodiments 1 to 3.

(10) Besides each of the embodiments described above, the specific type of translucent material that constitutes the spacer layer may be changed as appropriate.

(11) Although each of the embodiments described above has illustrated a case where the spacer layer is made of a translucent material, the spacer layer may alternatively be made of a light blocking material.

(12) Although each of the embodiments described above has illustrated a case where the first wire and the second wire are made of metal nanoink containing silver, the first wire and the second wire may alternatively be made of gold nanoink, copper nanoink, a conductive paste such as a silver paste, black fullerene ink, carbon ink, or carbon-based material ink or, furthermore, may alternatively be made of hybrid ink obtained by mixing fullerene ink, carbon ink, or carbon-based material ink into metal nanoink.

(13) Although each of the embodiments described above has illustrated a case where the first imprint layer and the second imprint layer are made of an ultraviolet-curable resin material, the first imprint layer and the second imprint layer may alternatively be made of a visible-light-curable resin material (which is a type of photo-curable resin material that is cured by irradiation with visible light), a thermosetting resin material, a thermoplastic resin material, or the like.

(14) Although each of the embodiments described above has illustrated a method for manufacturing a touch panel that is integrally provided in a liquid crystal panel, a method for manufacturing a touch panel that is integrally provided in an organic EL panel is also applicable. The organic EL panel includes a substrate, made of glass or synthetic resin, on which the touch panel is provided.

(15) Besides each of the embodiments described above, it is also of course possible to interchange the direction of arrangement of the first touch electrodes and the direction of arrangement of the second touch electrodes.

(16) Although each of the embodiments described above has illustrated a case where the touch electrodes are rhomboidal in planar shape, the planar shapes of the touch electrodes may be changed as appropriate to other shapes such as squares, circles, polygons with five or more angles.

(17) Although each of the embodiments described above has illustrated a mutual capacitance touch panel pattern, the present invention is also applicable to a self-capacitance touch panel pattern.

(18) Although each of the embodiments described above has illustrated a case where the planar shape of the liquid crystal display device is a horizontally long square, the planar shape may alternatively be a vertically long square or a regular square or may be a non-square shape such as a circle or an elliptical trapezoid.

(19) Besides each of the embodiments described above, the specific screen size of the liquid crystal panel may be changed as appropriate, for example, to be smaller than 70 inches or larger than 100 inches.

REFERENCE SIGNS LIST 20, 320 Touch panel (circuit board)
23, 323 First touch electrode (first position detecting electrode)
24, 324 Second touch electrode (second position detecting electrode)
25, 125, 325 First imprint layer
26, 326 Second imprint layer
27 First wire forming groove portion
28, 228, 328 First wire
29, 329 Second wire forming groove portion
30, 230, 330 Second wire
31A, 331A First terminal area (terminal)
33, 133 Spacer layer
33A End
38 Spacer layer attaching member
39 Retaining adhesive layer (strong adhesive layer, weak adhesive layer)
40 Temporal tacking adhesive layer (weak adhesive layer)
41 Delaminating member
42 Delaminating adhesive layer (strong adhesive layer)
45 Spacer layer
45A First portion
45B Second portion
45C Separation facilitating portion
46 First dummy electrode
47 Second dummy electrode
48 Weak adhesive layer
49 Strong adhesive layer

The invention claimed is:

1. A method for manufacturing a circuit board, the method comprising:
a first imprint layer forming step of forming a first imprint layer;
a first groove portion forming step of forming a first wire forming groove portion by partially depressing a surface of the first imprint layer;
a first wire forming step of forming a first wire in the first wire forming groove portion;
a spacer layer forming step of forming a spacer layer so that the spacer layer is placed over the surface of the first imprint layer in which the first wire forming groove portion has been formed and overlaps a part of at least the first wire;
a second imprint layer forming step of forming a second imprint layer so that at least the spacer layer is sandwiched between the first imprint layer and the second imprint layer;

a second groove portion forming step of forming a second wire forming groove portion by partially depressing a surface of the second imprint layer opposite to the first imprint layer;

a second wire forming step of forming a second wire in the second wire forming groove portion; and a spacer layer delaminating step of delaminating at least a part of the spacer layer from the first imprint layer and removing, together with the delaminated portion, a portion of the second imprint layer that overlaps the delaminated portion.

2. The method according to claim 1, wherein in the spacer layer forming step, the spacer layer is formed to have a range of formation that overlaps a part of the first wire, and in the spacer layer delaminating step, the spacer layer is entirely delaminated from the first imprint layer.

3. The method according to claim 2, wherein in the spacer layer forming step, the spacer layer is formed so as to be thinner than the second imprint layer, and in the second imprint layer forming step, the second imprint layer is formed by applying a hardening resin material onto the first imprint layer and the spacer layer.

4. The method according to claim 2, wherein in the spacer layer forming step, the spacer layer whose surface facing the first imprint layer is provided with a strong adhesive layer having a relatively strong adhesive force is attached via a weak adhesive layer having a relatively weak adhesive force to a spacer layer attaching member placed on a side of the spacer layer opposite to the first imprint layer, and after the spacer layer has been pasted so that the strong adhesive layer makes contact with the first imprint layer, the spacer layer attaching member is delaminated from the spacer layer.

5. The method according to claim 2, wherein in the spacer layer forming step, the spacer layer is pasted to the first imprint layer via a weak adhesive layer having a relatively weak adhesive force, and in the spacer layer delaminating step, after a delaminating member has been pasted to the spacer layer via a strong adhesive layer having a relatively strong adhesive force from the side of the spacer layer opposite to the first imprint layer, the delaminating member is delaminated from the first imprint layer together with the spacer layer.

6. The method according to claim 1, wherein in the spacer layer forming step, the spacer layer is formed to have a range of formation that overlaps an entirety of at least the first wire, and in the spacer delaminating step, a first portion of the spacer layer that overlaps a part of the first wire is delaminated from the first imprint layer while being separated from a second portion of the spacer layer other than the first portion.

7. The method according to claim 6, wherein in the spacer layer forming step, a separation facilitating portion is formed between the first and second portions of the spacer layer to facilitate separation of the first and second portions from each other.

8. The method according to claim 6, wherein in the spacer layer forming step, the spacer layer is pasted to the first imprint layer while a weak adhesive layer having a relatively weak adhesive force is sandwiched between the first portion of the spacer layer and the first imprint layer and a strong adhesive layer having a relatively strong adhesive force is sandwiched between the second portion and the first imprint layer.

9. The method according to claim 6, wherein in the spacer layer forming step, the spacer layer is formed to have a range of formation that overlaps an entirety of the first imprint layer.

10. The method according to claim 1, wherein in the spacer layer forming step, an end of the spacer layer is projected laterally from an outer end of the first imprint layer.

11. The method according to claim 1, wherein in the second imprint layer forming step, the second imprint layer is made of a photo-curable resin material, in the second groove portion forming step, the second imprint layer in which the second wire forming groove portion has been formed is irradiated with light for curing, and in the spacer layer forming step, the spacer layer is made of a translucent material.

12. The method according to claim 1, wherein in the first and second wire forming steps, the first and second wires are formed to constitute first and second position detecting electrodes, respectively, that form electrostatic capacitances with a position input body which performs a position input in a plate surface of the circuit board, that is capable of detecting a position inputted by the position input body, and that do not overlap each other, and in addition, the first and second wires are formed to constitute first and second dummy electrodes, respectively, placed adjacent to the first and second position detecting electrodes, respectively, but separated from the first and second position detecting electrodes, that do not overlap each other.

* * * * *